(12) United States Patent
Phan et al.

(10) Patent No.: US 12,349,281 B2
(45) Date of Patent: Jul. 1, 2025

(54) PRINTED CIRCUIT BOARDS WITH INTEGRATED INDUCTORS AND ANTENNAS

(71) Applicant: Super Micro Computer, Inc., Fremont, CA (US)

(72) Inventors: Manhtien V. Phan, Morgan Hill, CA (US); Chih-Hao Lee, New Taipei (TW)

(73) Assignee: Super Micro Computer, Inc., San Jose, CA (US)

(*) Notice: Subject to any disclaimer, the term of this patent is extended or adjusted under 35 U.S.C. 154(b) by 230 days.

(21) Appl. No.: 18/327,741

(22) Filed: Jun. 1, 2023

(65) Prior Publication Data
US 2024/0407102 A1 Dec. 5, 2024

(51) Int. Cl.
| | | |
|---|---|---|
| *H05K 1/18* | (2006.01) | |
| *H01F 27/24* | (2006.01) | |
| *H01F 27/28* | (2006.01) | |
| *H01F 27/32* | (2006.01) | |
| *H05K 1/11* | (2006.01) | |
| *H05K 1/16* | (2006.01) | |

(52) U.S. Cl.
CPC ............. *H05K 1/182* (2013.01); *H01F 27/24* (2013.01); *H01F 27/2823* (2013.01); *H01F 27/32* (2013.01); *H05K 1/115* (2013.01); *H05K 2201/1003* (2013.01); *H05K 2201/10098* (2013.01)

(58) Field of Classification Search
CPC ................... H05K 1/182; H05K 1/165; H05K 2201/1003; H05K 2201/10098; H01F 27/24; H01F 17/04; H01F 27/2823
See application file for complete search history.

(56) References Cited

U.S. PATENT DOCUMENTS

| | | | | |
|---|---|---|---|---|
| 2010/0295652 A1* | 11/2010 | Mori | ................... | H01F 17/0033 336/232 |
| 2011/0109416 A1* | 5/2011 | Hsiao | ..................... | H05K 1/165 336/200 |
| 2016/0276091 A1* | 9/2016 | Zhang | ................. | H01F 27/2804 |
| 2021/0125944 A1* | 4/2021 | Lambert | ............... | H01L 23/645 |

OTHER PUBLICATIONS

"Antenna Theory—Quick Guide", Tutorialspoint, Downloaded Aug. 18, 2023, https://www.tutorialspoint.com/antenna_theory/antenna_theory_quick_guide.htm.

(Continued)

*Primary Examiner* — Sherman Ng
(74) *Attorney, Agent, or Firm* — Beyer Law Group LLP

(57) ABSTRACT

A printed circuit board (PCB) has electronic components of an electrical circuit mounted thereon. The PCB includes a wire that is coiled through the PCB one or more turns to form a coil of an inductor or an antenna that is integrated with the PCB. The PCB can include a cutout for accepting an inductor core. The shape and/or size of the inductor core can be varied to achieve a target inductance. Both ends of the wire can be electrically connected to corresponding nodes of the electrical circuit. One end of the wire can be electrically connected to a node of the electrical circuit, and the other end of the wire can be electrically connected to an antenna body.

13 Claims, 18 Drawing Sheets

(56) References Cited

OTHER PUBLICATIONS

"Via (Electronics)", Wikipedia, Downloaded Aug. 25, 2023, https://en.wikipedia.org/wiki/Via_(electronics)#:~:text=In%20integrated%20circuit%20(IC)%20design,-silicon%20via%20via%20(TSV).

"FR-4", Wikipedia, https://en.wikipedia.org/wiki/FR-4, downloaded May 5, 2023.

"Inductor", Wikipedia, https://en.wikipedia.org/wiki/Inductor#:~:text=An, downloaded May 5, 2023.

"Monopole antenna", Wikipedia, https://en.wikipedia.org/wiki/Monopole_antenna#:~:text=A, downloaded May 10, 2023.

Zachariah Peterson, "What is PCB and Intro to PCB Design", Altium, https://resources.altium.com/p/what-is-a-pcb, Oct. 5, 2020.

* cited by examiner

PRINTED CIRCUIT BOARDS WITH INTEGRATED INDUCTORS AND ANTENNAS

TECHNICAL FIELD

The present disclosure is directed to printed circuit boards and electronic components.

BACKGROUND

A printed circuit board (PCB) is an electronic assembly that provides mechanical support and electrical connection for electronic components, such as integrated circuits, inductors, capacitors, resistors, etc. A PCB includes electrically conductive features for interconnecting electronic components that are mounted on the PCB. PCBs are found in many electronic devices, such as server computers, laptops, smart watches, mobile phones, etc. Because electronic devices are increasingly becoming smaller and more complicated, it is advantageous to be able to increase the number of electronic components that can be mounted on a PCB.

BRIEF SUMMARY

In one embodiment, a printed circuit board (PCB) has electronic components of an electrical circuit mounted thereon. The PCB includes a wire that is coiled through topmost and bottommost layers of the PCB one or more turns to form a coil of an inductor or an antenna that is integrated with the PCB. The PCB may include a cutout for receiving an inductor core. The shape and/or size of the inductor core may be varied to achieve a target inductance. Both ends of the wire may be electrically connected to corresponding nodes of the electrical circuit. One end of the wire may be electrically connected to a node of the electrical circuit, and the other end of the wire may be electrically connected to an antenna body.

These and other features of the present disclosure will be readily apparent to persons of ordinary skill in the art upon reading the entirety of this disclosure, which includes the accompanying drawings and claims.

BRIEF DESCRIPTION OF THE DRAWINGS

A more complete understanding of the subject matter may be derived by referring to the detailed description and claims when considered in conjunction with the following figures, wherein like reference numbers refer to the same or similar elements throughout the figures. The drawings are not necessarily to scale.

DETAILED DESCRIPTION

In the present disclosure, numerous specific details are provided, such as examples of components, structures, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Generally, a printed circuit board (PCB) may accommodate a plurality of electronic components. Such electronic components may be mounted and electrically interconnected on the PCB to form one or more electrical circuits. Integrated inductors and integrated antennas disclosed herein may be electrically connected to electronic components of one or more electrical circuits that are mounted on the PCB.

Figure 1:
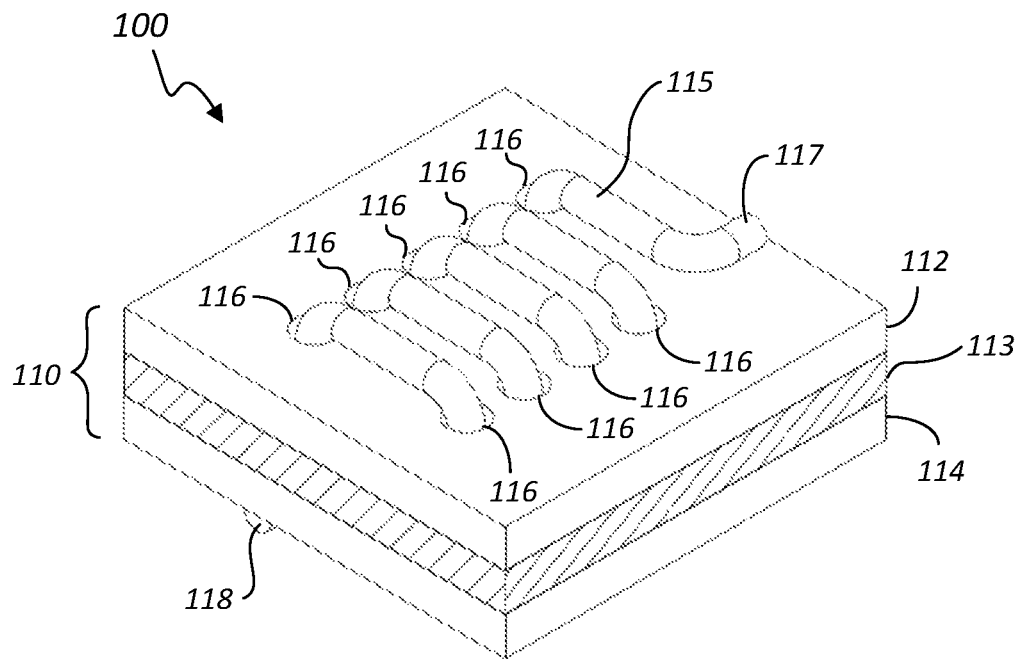
FIG. 1 shows a perspective view of an integrated inductor in accordance with an embodiment of the present invention.

FIG. 1 shows a perspective view of an integrated inductor 100 in accordance with an embodiment of the present invention. The inductor 100 is "integrated" in that it is integrated with a PCB 110. Only a section of the PCB 110 that includes the inductor 100 is shown for clarity of illustration.

The PCB 110 may comprise one or more layers of materials that are stacked one on top of another. In the example of FIG. 1, the PCB 110 has a top layer 112, one or more intermediate layers 113, and a bottom layer 114. The top layer 112 is the topmost layer of the PCB 110, whereas the bottom layer 114 is the bottommost layer of the PCB 110. The top layer 112 and the bottom layer 114 may each comprise an electrically conducting material (e.g., copper). The one or more intermediate layers 113 may comprise an electrically insulating material (e.g., FR-4 glass epoxy) or alternating layers of electrically insulating and electrically conducting materials.

Outermost surfaces of the top layer 112, bottom layer 114, or both may be coated with a solder mask. Electronic components may be mounted on the top layer 112 in the case where the PCB 110 is a single-sided PCB. Electronic components may be mounted on the top layer 112 and on the bottom layer 114 in the case where the PCB 110 is a double-sided PCB. Generally, the PCB 110 may be a conventional PCB that is adapted to accept the inductor 100 as disclosed herein.

In the example of FIG. 1, the PCB 110 has a plurality of through holes 116, with each through hole 116 going all the way through the PCB 110. The inductor 100 comprises a continuous inductor wire 115 that may be coated with an electrically insulating material, such as a copper wire that is coated with enamel. The wire 115 has a first end 117 and a second end 118. The wire 115 is coiled through the PCB 110 one or more turns by way of the through holes 116 to form a coil. That is, the wire 115 goes from the top layer 112 toward the bottom layer 114 through a through hole 116, from the bottom layer 114 back toward the top layer 112 through another through hole 116, etc. The first end 117 of the wire 115 is depicted as being over the top layer 112, and the second end 118 of the wire 115 is depicted as being under the bottom layer 114. As can be appreciated, the first end 117 and the second end 118 may be disposed on the same side of the PCB 110, on opposite sides of the PCB 110, or within the PCB 110 (i.e., between the layers 112 and 114).

Figure 2:
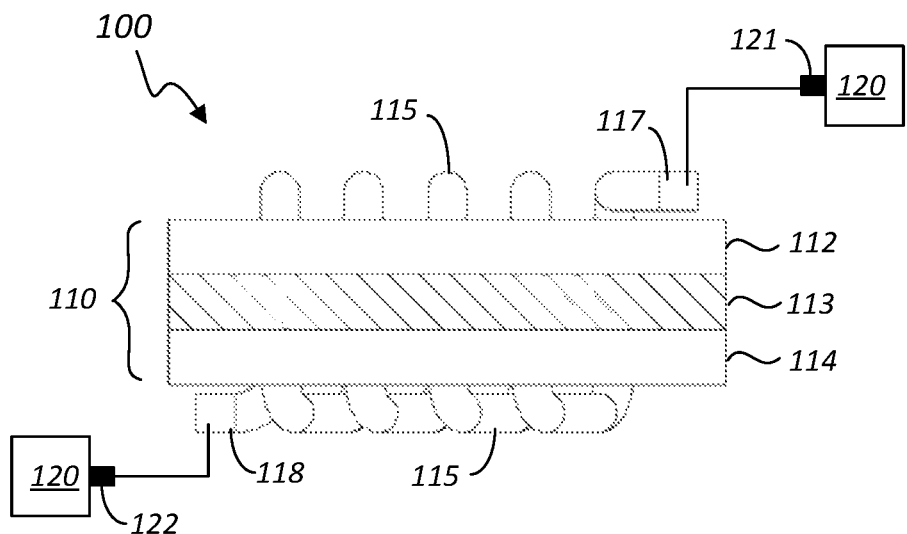
FIG. 2 shows a side view of the inductor of FIG. 1 in accordance with an embodiment of the present invention.

FIG. 2 shows a side view of the inductor 100 in accordance with an embodiment of the present invention. The wire 115 coils through the PCB 110 by going from the top layer 112 through one or more intermediate layers 113 toward the bottom layer 114. From the bottom layer 114, the wire 115 continues through one or more intermediate layers 113 toward the top layer 112, and so on.

Also shown in FIG. 2 is a schematic representation of an electrical circuit 120 comprising electronic components (not shown) that are mounted on the PCB 110. The electrical circuit 120 may be a conventional electrical circuit, such as a filter, amplifier, resonant circuit, etc. Each of the ends 117 and 118 of the wire 115 may be electrically connected to a corresponding node of the electrical circuit 120. For example, the end 117 may be electrically connected to a node 121 of the electrical circuit 120, with the end 118 being connected to a node 122 (e.g., reference ground) of the electrical circuit 120. The nodes 121 and 122 may be terminals of electronic components of the electrical circuit 120.

Figure 3:
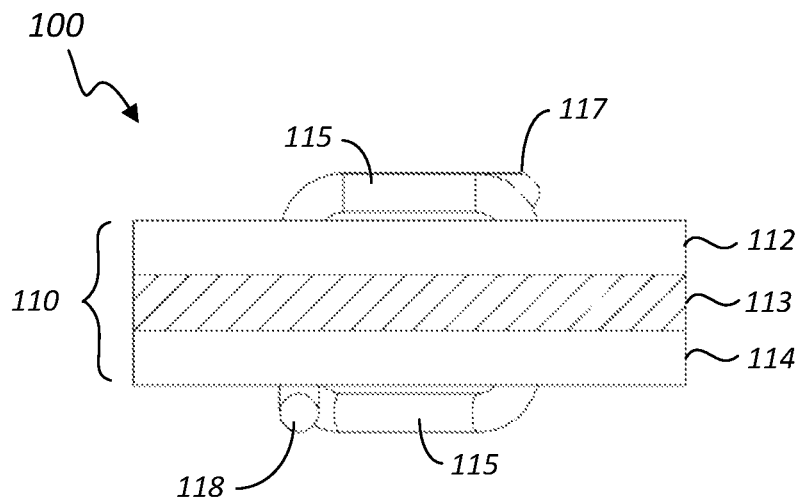
FIG. 3 shows a front view of the inductor of FIG. 1 in accordance with an embodiment of the present invention.

FIG. 3 shows a front view of the inductor 100 in accordance with an embodiment of the present invention. FIG. 3 shows the inductor 100 as seen with the second end 118 of the wire 115 being closer to the viewer relative to the first end 117 of the wire 115. The wire 115 coils through the layers 112-114 of the PCB 110 one or more times to form a coil.

Figure 4:
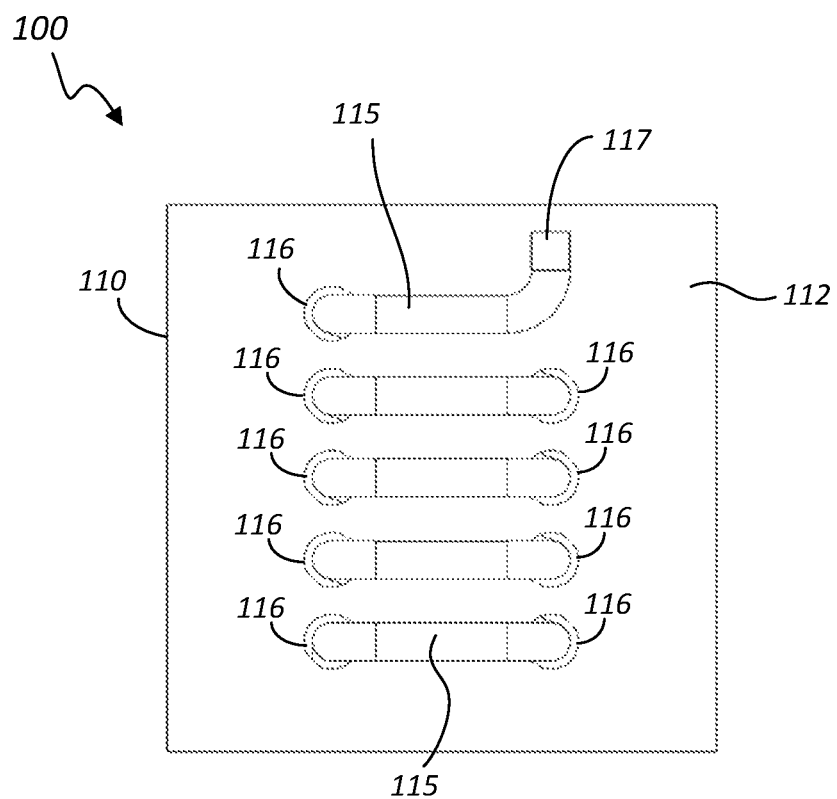
FIG. 4 shows a top view of the inductor of FIG. 1 in accordance with an embodiment of the present invention.

FIG. 4 shows a top view of the inductor 100 in accordance with an embodiment of the present invention. The wire 115 of the inductor 100 goes all the way through the PCB 110 by way of the through holes 116. The first end 117 of the wire 115 is shown as being over the top layer 112.

Figure 5:
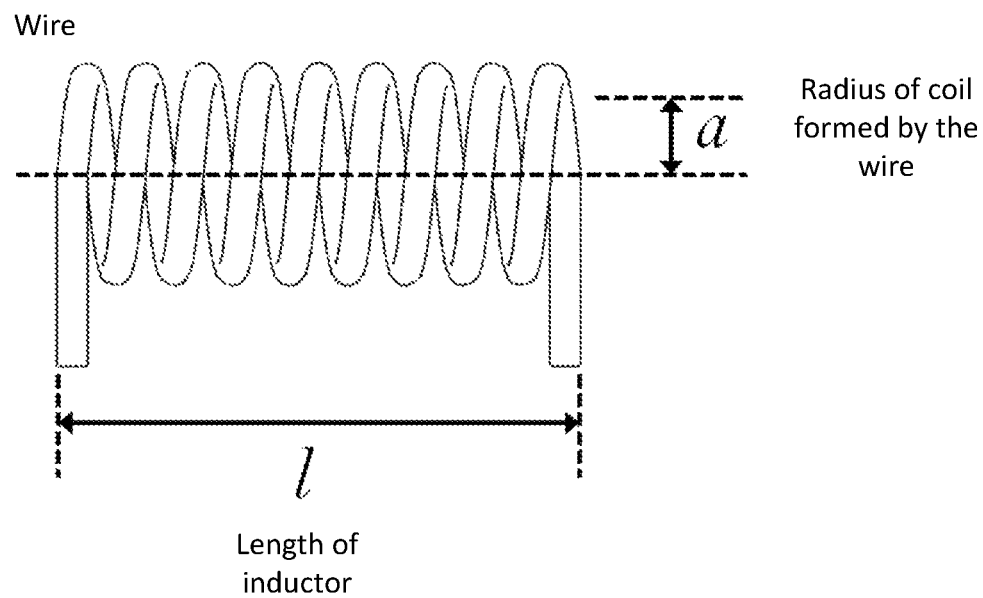
FIG. 5 pictorially illustrates variables of an equation for determining the inductance of an integrated inductor.

The inductor 100 is a coreless inductor (i.e., has no inductor core), because the materials of the PCB 110, within the coil formed by the wire 115, do not have magnetic properties that appreciably affect the inductance of the inductor 100. The inductance of such a coreless inductor integrated with a PCB is given by equation EQ. 1 below, $$L = \frac{2.54(\alpha N)^2}{(22.9\alpha + 25.4l)} \quad \text{(EQ. 1)}$$

where L is the inductance in nH of the inductor, a is the radius in mil (i.e., 0.001 inch) of the coil formed by the wire, N is the number of turns of the wire through the PCB, and l is the length in mil of the inductor. FIG. 5 pictorially illustrates the variables a and l of equation EQ. 1. Generally, the effect of the PCB on the resulting inductance of the inductor may be modeled (e.g., using a suitable simulation software) to achieve a target inductance for a given circuit application.

Figure 6:
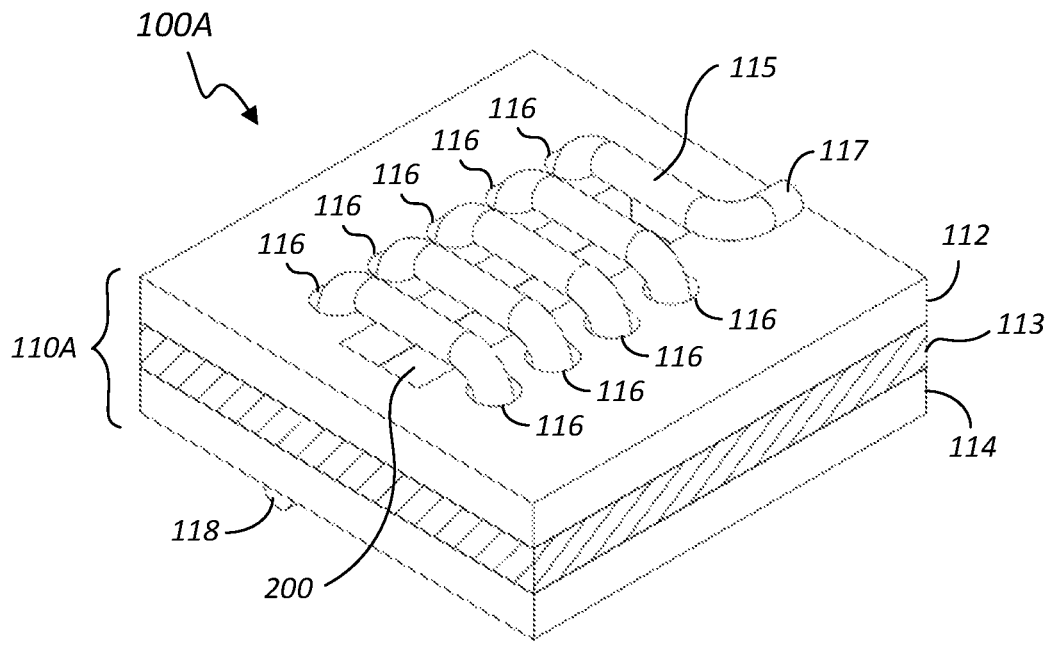
FIG. 6 shows a perspective view of an integrated inductor in accordance with an embodiment of the present invention.

FIG. 6 shows a perspective view of an integrated inductor 100A in accordance with an embodiment of the present invention. The inductor 100A is the same as the inductor 100 (shown in FIGS. 1-4), except that the PCB 110A of the inductor 100A has a cutout 200. The PCB 110A and PCB 110 are otherwise the same.

The cutout 200 may be an empty, rectangular space that is cut all the way through the layers 112-114 of the PCB 110A and runs along the length of the inductor 100A. The wire 115 is coiled through the PCB 110A one or more turns by way of the through holes 116 to form a coil, with the cutout 200 being disposed within the coil and serving as an air core of the inductor 100A. The wire 115 goes from the top layer 112 toward the bottom layer 114 through a through hole 116, from the bottom layer 114 back toward the top layer 112 through another through hole 116, etc. The first end 117 of the wire 115 is depicted as being over the top layer 112, and the second end 118 of the wire 115 is depicted as being under the bottom layer 114. As can be appreciated, the first end 117 and the second end 118 may be disposed on the same side of the PCB 110A, on opposite sides of the PCB 110A, or within the PCB 110A.

Figure 7:
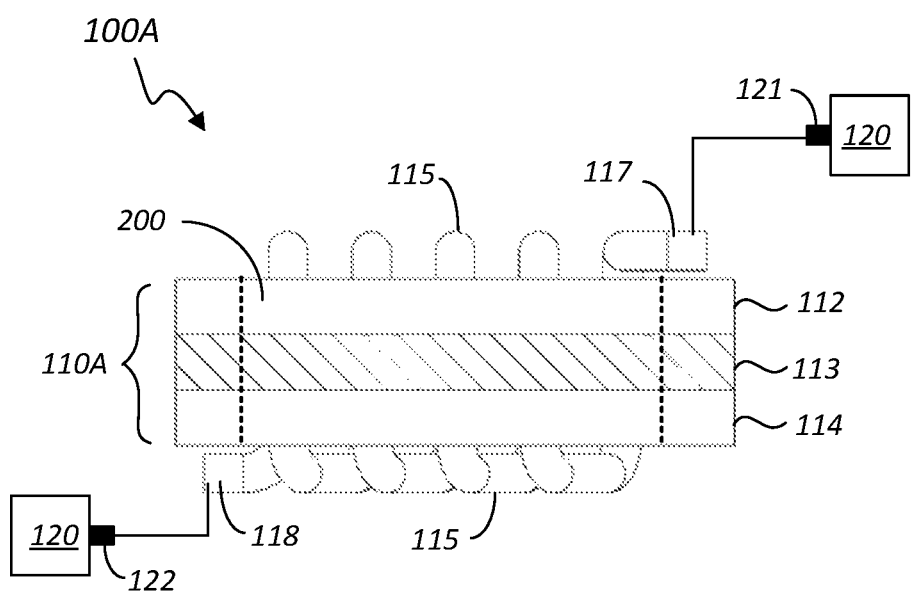
FIG. 7 shows a side view of the inductor of FIG. 6 in accordance with an embodiment of the present invention.

FIG. 7 shows a side view of the inductor 100A in accordance with an embodiment of the present invention. In FIG. 7, dotted lines represent the cutout 200 through the PCB 110A. The cutout 200 cuts through the layers 112-114, thereby creating an air core within the coil formed by the wire 115.

Also shown in FIG. 7 is a schematic representation of the electrical circuit 120 comprising electronic components (not shown) that are mounted on the PCB 110A. Each of the ends 117 and 118 of the wire 115 may be electrically connected to a corresponding node of the electrical circuit 120. For example, the end 117 may be electrically connected to the node 121 of the electrical circuit 120, with the end 118 being connected to the node 122 of the electrical circuit 120.

Figure 8:
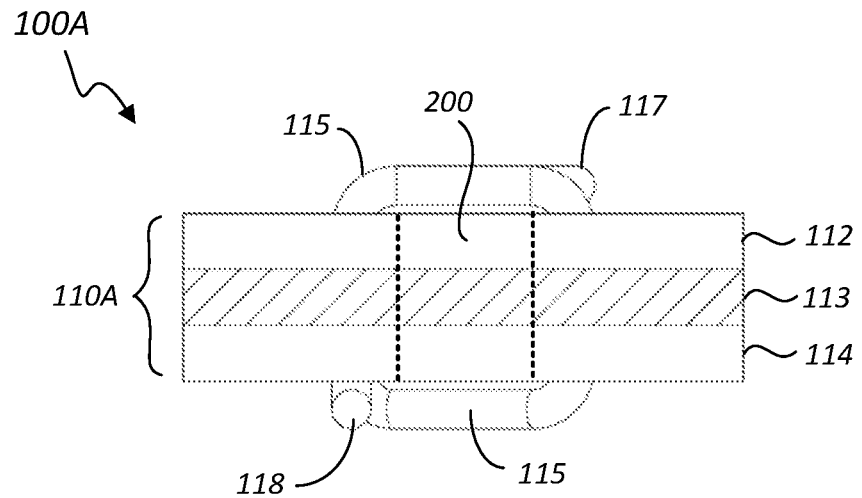
FIG. 8 shows a front view of the inductor of FIG. 6 in accordance with an embodiment of the present invention.

FIG. 8 shows a front view of the inductor 100A in accordance with an embodiment of the present invention. FIG. 8 shows the inductor 100A as seen with the second end 118 of the wire 115 being closer to the viewer relative to the first end 117 of the wire 115. In FIG. 8, dotted lines represent the cutout 200 through the layers 112-114 of the PCB 110A. The wire 115 coils through the layers 112-114 of the PCB 110A one or more times to form a coil, with the cutout 200 being located within the coil.

Figure 9:
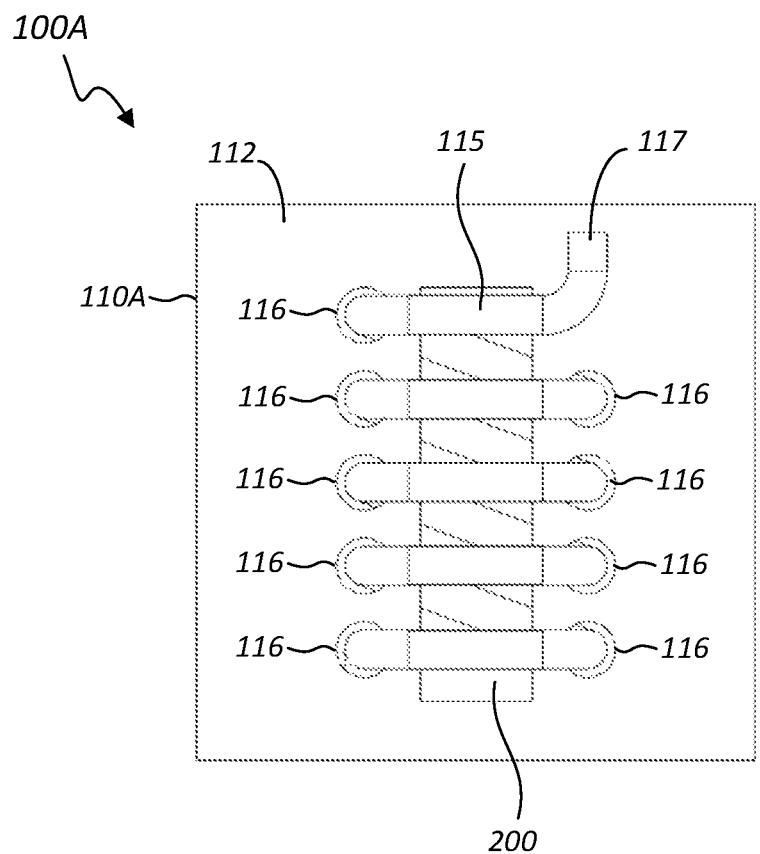
FIG. 9 shows a top view of the inductor of FIG. 6 in accordance with an embodiment of the present invention.

FIG. 9 shows a top view of the inductor 100A in accordance with an embodiment of the present invention. The cutout 200 is located between the through holes 116 of the PCB 110A, and runs along the length of the inductor 100A within the coil formed by the wire 115. FIG. 9 shows the first end 117 of the wire 115 over the top layer 112.

The inductor 100A is an air core inductor. Because air is a non-magnetic material, the inductor 100A behaves as a coreless inductor. Accordingly, the inductance of the inductor 100A is given by the previously noted equation EQ.1.

Figure 10:
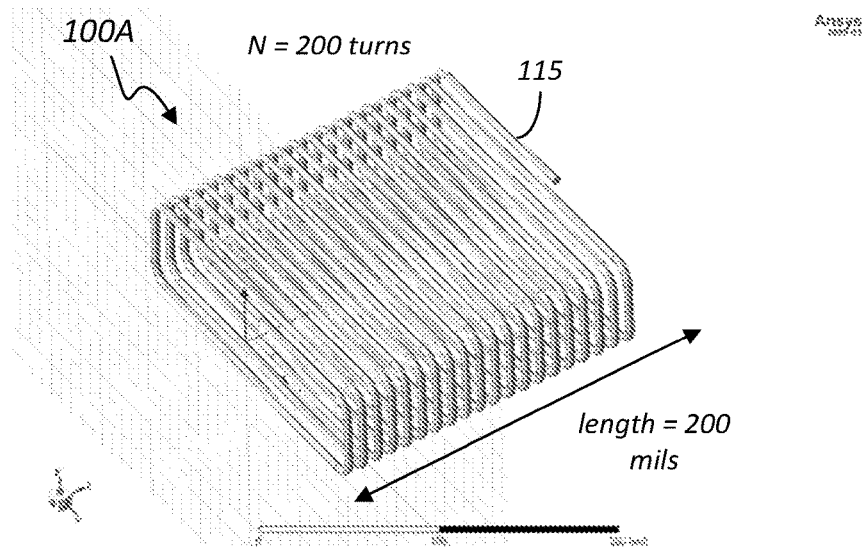
FIG. 10 shows a graphical representation of a simulation performed on the inductor of FIG. 6.
Figure 11:
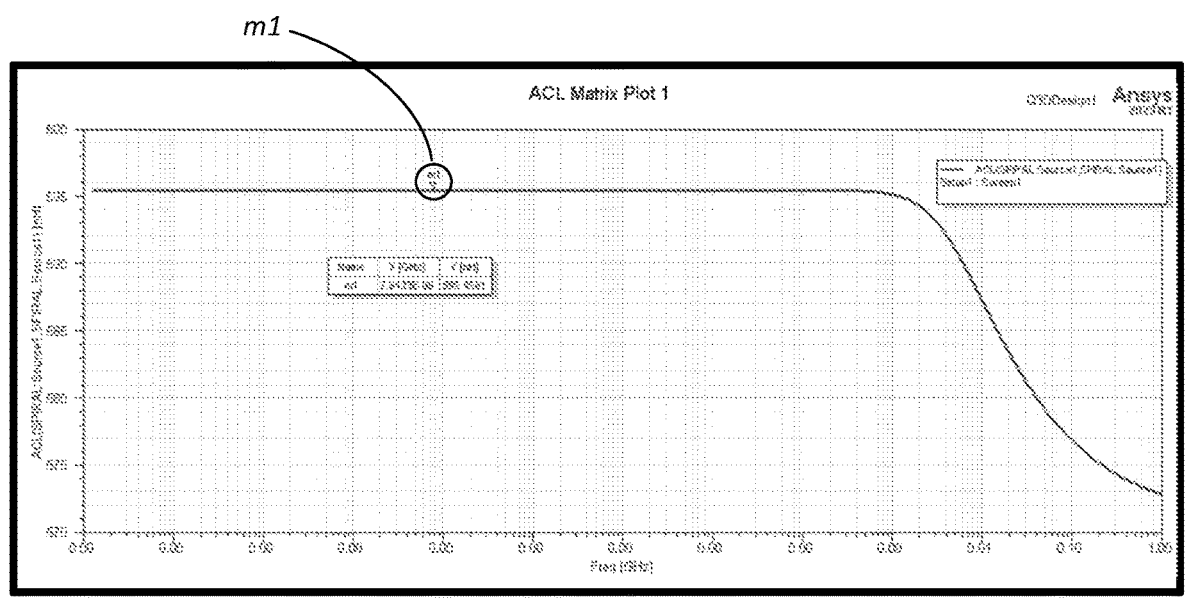
FIG. 11 shows a plot of inductance versus frequency that results from the simulation of FIG. 10.

FIG. 10 shows a graphical representation of a simulation performed on the inductor 100A. The simulation was performed using the ANSYS 2023 R1 simulation software, which is commercially-available from ANSYS, Inc. In the simulation of FIG. 10, the wire 115 is a copper wire with a wire diameter of 5 mils, and the inductor 100A has 200 turns and a length of 200 mils. FIG. 11 shows a plot of inductance versus frequency that results from the simulation of FIG. 10. In FIG. 11, the vertical axis represents inductance in nH and the horizontal axis represents frequency in Ghz. For reference, at the point m1, the inductor 100A in the simulation has an inductance of around 595 nH at around 7.95 Hz.

Figure 12:
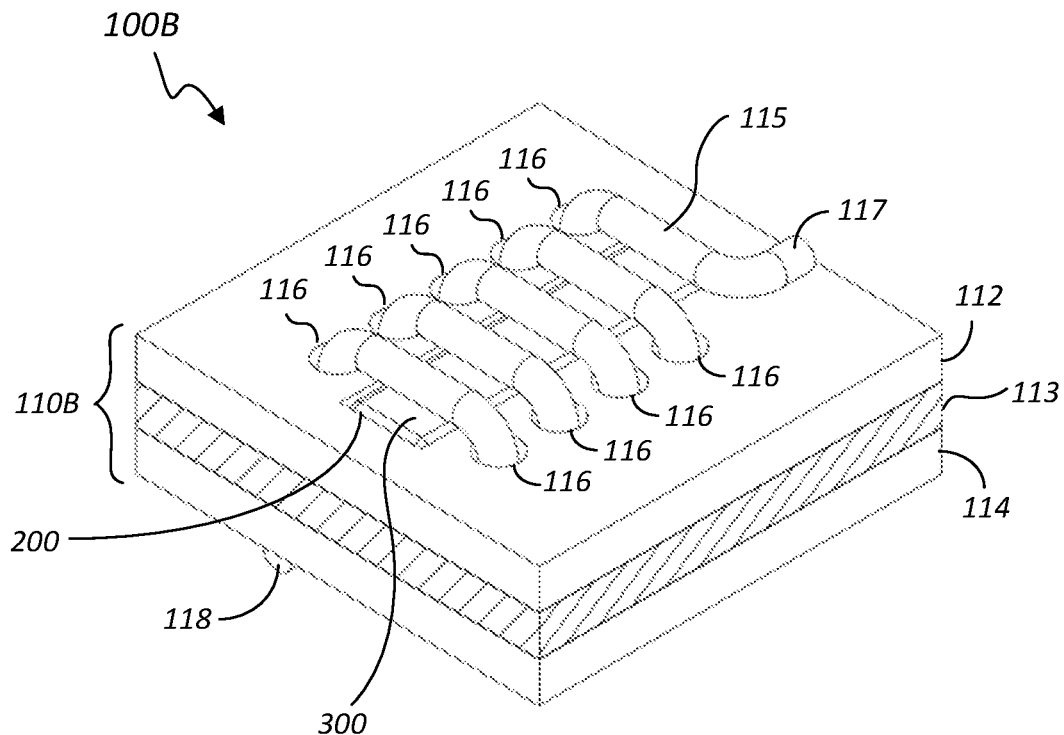
FIG. 12 shows a perspective view of an integrated inductor in accordance with an embodiment of the present invention.

FIG. 12 shows a perspective view of an integrated inductor 100B in accordance with an embodiment of the present invention. The inductor 100B is the same as the inductor 100A (shown in FIGS. 6-9), except that the PCB 110B of the inductor 100B has an inductor core 300 inserted in the cutout 200. The PCB 110B and PCB 110A are otherwise the same.

The inductor core 300 may comprise a magnetic material commonly used in inductors, such as iron powder and ferrites. The inductor core 300 is disposed in the cutout 200. The inductor core 300 may be fitted into the cutout 200, attached into the cutout 200 by adhesives, held in position by support structures (not shown) in the cutout 200, etc. The inductor core 300 may have a rectangular shape, cylindrical shape, two-half cylindrical shapes, or other shape that fits in the cutout 200. Changing the shape and/or size of the inductor core 300 allows for adjustment of the inductance of the integrated inductor.

The through holes 116 go all the way through the layers 112-114. The wire 115 coils through the PCB 110B one or more turns by way of the through holes 116 to form a coil, with the inductor core 300 being disposed within the coil and running along the length of the inductor 100B. The wire 115 goes from the top layer 112 toward the bottom layer 114 through a through hole 116, from the bottom layer 114 back toward the top layer 112 through another through hole 116, etc. The first end 117 of the wire 115 is depicted as being over the top layer 112, and the second end 118 of the wire 115 is depicted as being under the bottom layer 114. The first end 117 and the second end 118 may be disposed on the same side of the PCB 110B, on opposite sides of the PCB 110B, or within the PCB 110B.

Figure 13:
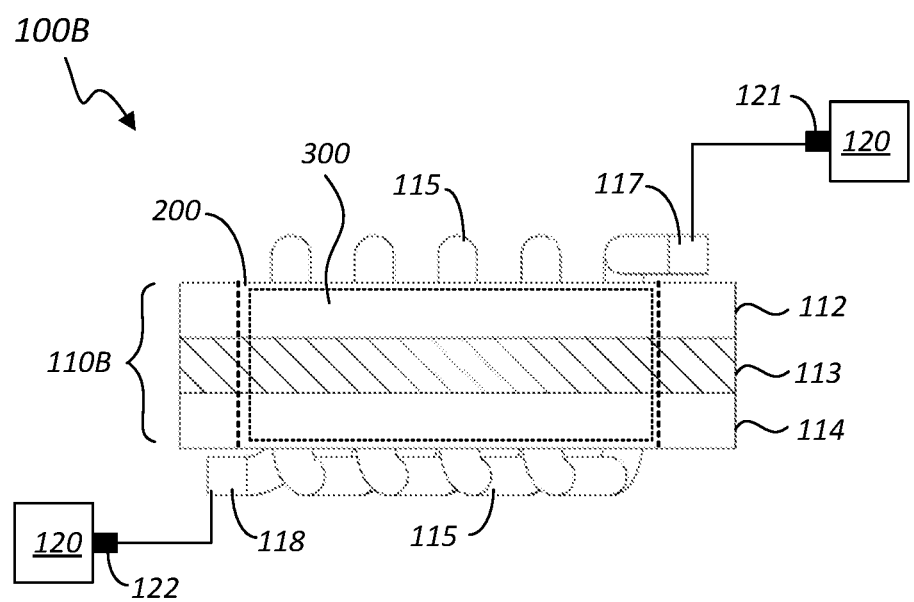
FIG. 13 shows a side view of the inductor of FIG. 12 in accordance with an embodiment of the present invention.

FIG. 13 shows a side view of the inductor 100B in accordance with an embodiment of the present invention. In FIG. 13, dotted lines represent the cutout 200 through the layers 112-114, and a dotted rectangular box represents the inductor core 300 disposed in the cutout 200. The inductor core 300 substantially completely fills the empty space of the cutout 200.

Also shown in FIG. 13 is a schematic representation of the electrical circuit 120 comprising electronic components (not shown) that are mounted on the PCB 110B. Each of the ends 117 and 118 of the wire 115 may be electrically connected to a corresponding node of the electrical circuit 120. For example, the end 117 may be electrically connected to the node 121 of the electrical circuit 120, with the end 118 being connected to the node 122 of the electrical circuit 120.

Figure 14:
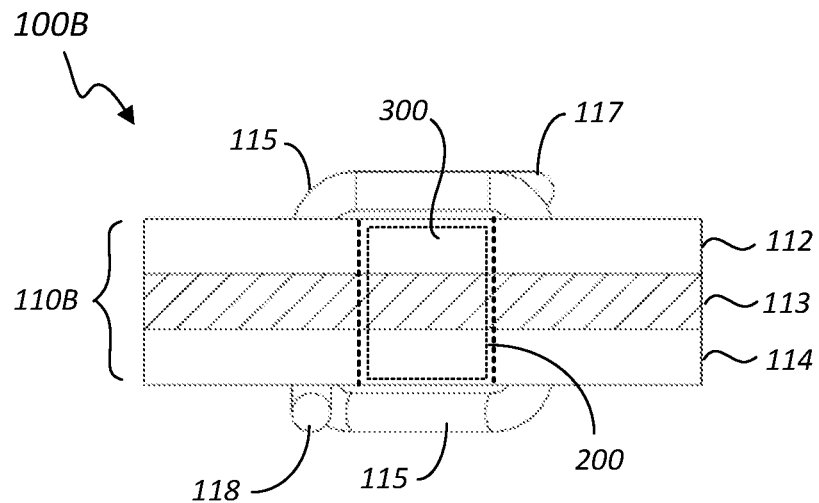
FIG. 14 shows a front view of the inductor of FIG. 12 in accordance with an embodiment of the present invention.

FIG. 14 shows a front view of the inductor 100B in accordance with an embodiment of the present invention. FIG. 14 shows the inductor 100B as seen with the second end 118 of the wire 115 being closer to the viewer relative to the first end 117 of the wire 115. In FIG. 14, dotted lines represent the cutout 200, and a dotted rectangular box represents the inductor core 300 disposed in the cutout 200 in the PCB 110B. The wire 115 coils through the layers 112-114 of the PCB 110B one or more times to form a coil, with the inductor core 300 being located within the coil.

Figure 15:
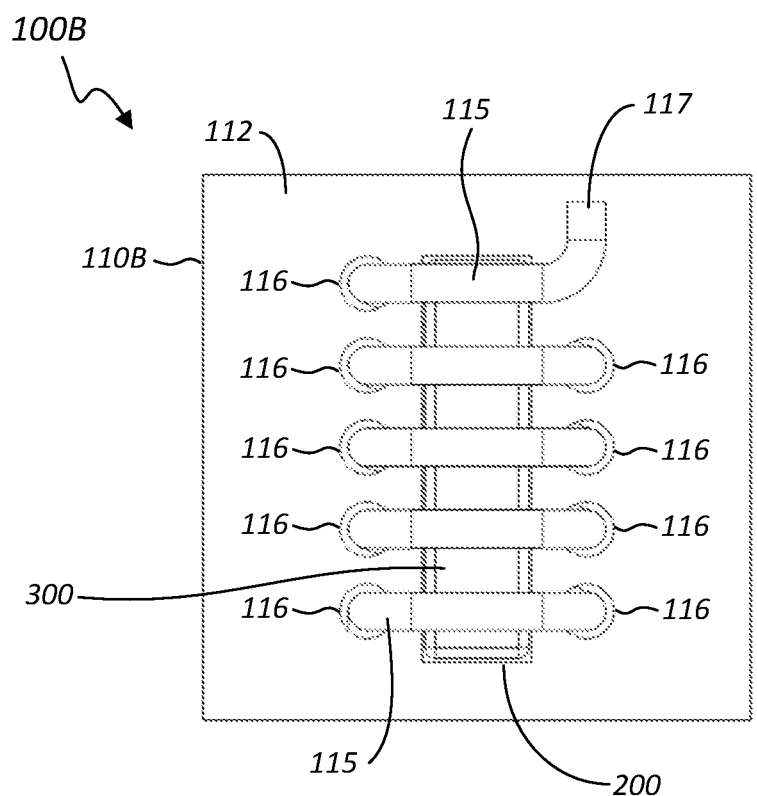
FIG. 15 shows a top view of the inductor of FIG. 12 in accordance with an embodiment of the present invention.

FIG. 15 shows a top view of the inductor 100B in accordance with an embodiment of the present invention. The inductor core 300 is located between the through holes 116 of the PCB 110B, and runs along the length of the inductor 100B within the coil formed by the wire 115. FIG. 15 shows the first end 117 of the wire 115 over the top layer 112.

The inductor 100B is an inductor with a magnetic core. The inductance of such an inductor integrated with a PCB is given by equation EQ. 2 below.

$$L = \frac{\mu_r \mu_0 N^2 A \times 10^9}{39370.079l} = \frac{\mu_r \mu_0 N^2 \pi a^2 \times 10^9}{39370.079l} \tag{EQ. 2}$$

where L is the inductance in nH of the inductor, a is the radius in mil of the coil formed by the wire, N is the number of turns of the wire through the PCB, l is the length in mil of the inductor, A is the area in mil$^2$ of the coil formed by the wire, $\mu_0$ is the permeability of free space, and $\mu_r$ is the relative permeability of the inductor core. The variables a (radius of coil) and l (length of inductor) are pictorially illustrated in FIG. 5.

Figure 16:
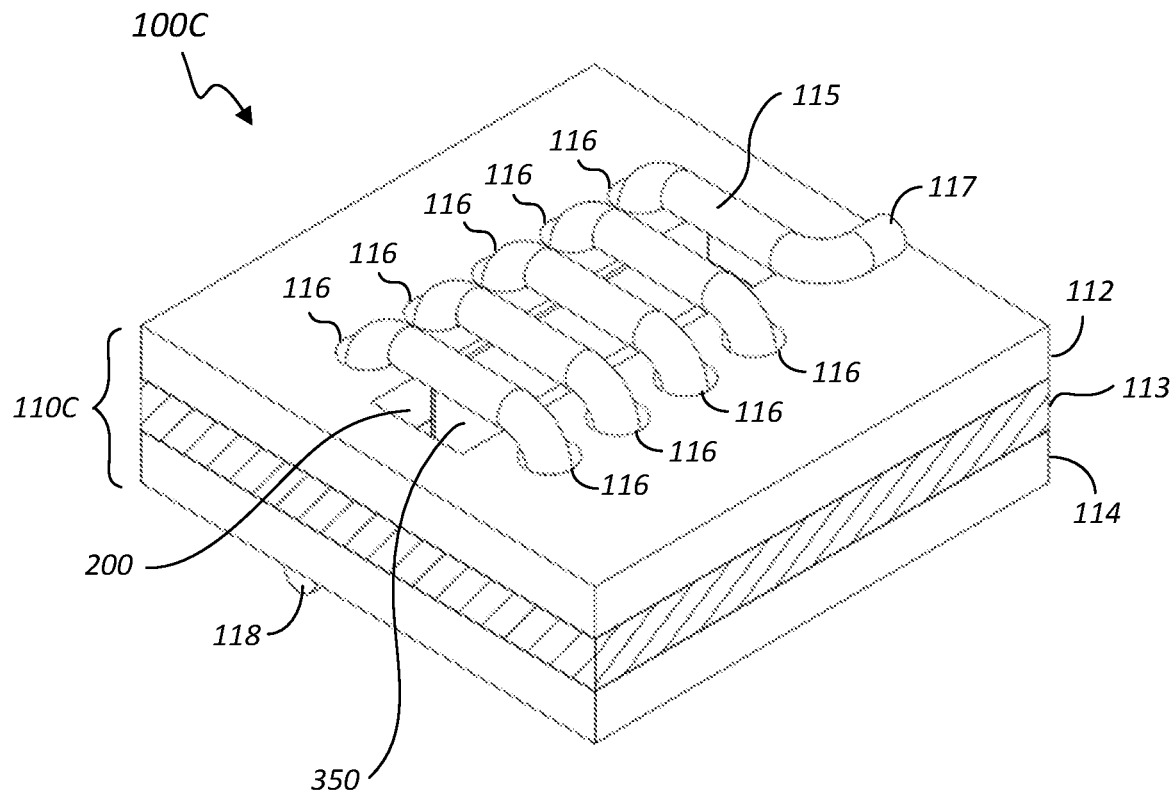
FIG. 16 shows a perspective view of an integrated inductor in accordance with an embodiment of the present invention.

FIG. 16 shows a perspective view of an integrated inductor 100C in accordance with an embodiment of the present invention. The inductor 100C is the same as the inductor 100B (shown in FIGS. 12-15), except that the PCB 110C of the inductor 100C has an inductor core 350, instead of the inductor core 300, in the cutout 200. The PCB 110C and PCB 110B are otherwise the same.

The inductor core 350 is the same as the inductor core 300 except that the inductor core 350 has a smaller physical dimension. Accordingly, unlike the inductor core 300, the inductor core 350 does not completely fill the empty space of the cutout 200 in the PCB 110C. For example, the physical size of the inductor core 350 may be 70% of that of the inductor core 300. The inductance of the inductor 100C is given by the previously noted equation EQ. 2, with the relative permeability of the inductor core u, being at percentage of adjustable target inductance.

Advantageously, by using different inductor core materials, shapes, and sizes, the inductance of the integrated inductor may be optimized for different circuit applications. More particularly, using the same PCB with cutout, the inductance of the integrated inductor may be adjusted to optimize an electrical circuit by simply replacing the inductor core. This is particularly advantageous in circuit applications where the integrated inductor is used in conjunction with capacitance that is fixed or not easily adjusted.

As shown in FIG. 16, the through holes 116 go all the way through the layers 112-114. The wire 115 coils through the PCB 110C one or more turns by way of the through holes 116 to form a coil, with the inductor core 350 being disposed within the coil and running along the length of the inductor 100C. The wire 115 goes from the top layer 112 toward the bottom layer 114 through a through hole 116, from the bottom layer 114 back toward the top layer 112 through another through hole 116, etc. The first end 117 of the wire 115 is depicted as being over the top layer 112, and the second end 118 of the wire 115 is depicted as being under the bottom layer 114. The first end 117 and the second end 118 may be disposed on the same side of the PCB 110C, on opposite sides of the PCB 110C, or within the PCB 110C.

Figure 17:
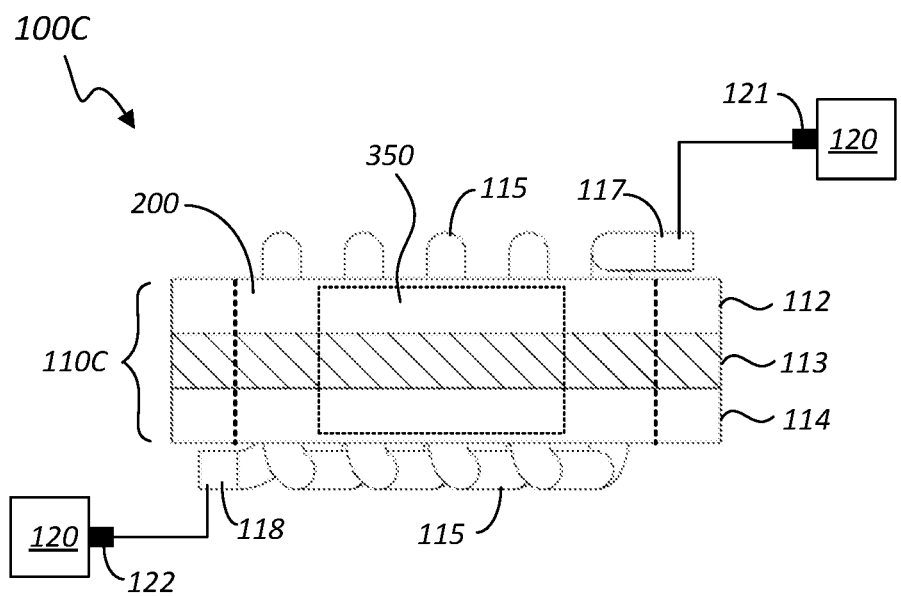
FIG. 17 shows a side view of the inductor of FIG. 16 in accordance with an embodiment of the present invention.

FIG. 17 shows a side view of the inductor 100C in accordance with an embodiment of the present invention. In FIG. 17, dotted lines represent the cutout 200 through the layers 112-114, and a dotted rectangular box represents the inductor core 350 disposed in the cutout 200. Note that the inductor core 350 does not completely fill the empty space of the cutout 200 in the PCB 110C. The inductor 100C thus has part air core and part magnetic core.

Also shown in FIG. 17 is a schematic representation of the electrical circuit 120 comprising electronic components (not shown) that are mounted on the PCB 110C. Each of the ends 117 and 118 of the wire 115 may be electrically connected to a corresponding node of the electrical circuit 120. For example, the end 117 may be electrically connected to the node 121 of the electrical circuit 120, with the end 118 being connected to the node 122 of the electrical circuit 120.

Figure 18:
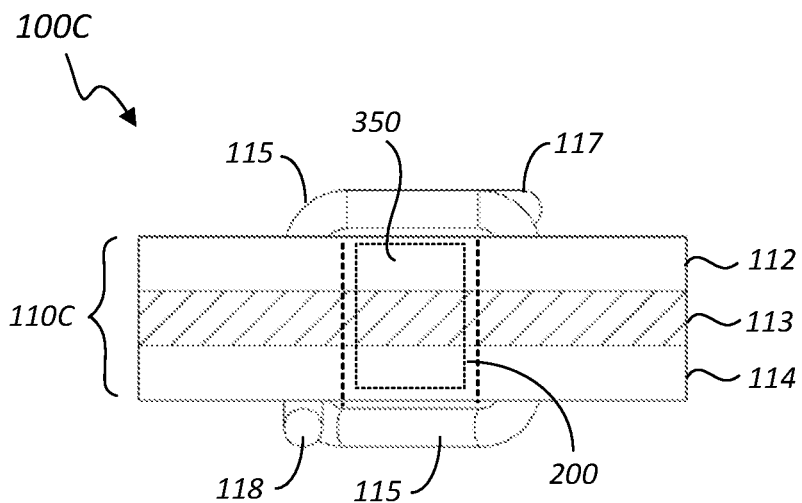
FIG. 18 shows a front view of the inductor of FIG. 16 in accordance with an embodiment of the present invention.

FIG. 18 shows a front view of the inductor 100C in accordance with an embodiment of the present invention. FIG. 18 shows the inductor 100C as seen with the second end 118 of the wire 115 being closer to the viewer relative to the first end 117 of the wire 115. In FIG. 18, dotted lines represent the cutout 200, and a dotted rectangular box represents the inductor core 350 disposed in the cutout 200. The wire 115 coils through the layers 112-114 of the PCB 110C one or more times to form a coil, with the inductor core 350 being located within the coil.

Figure 19:
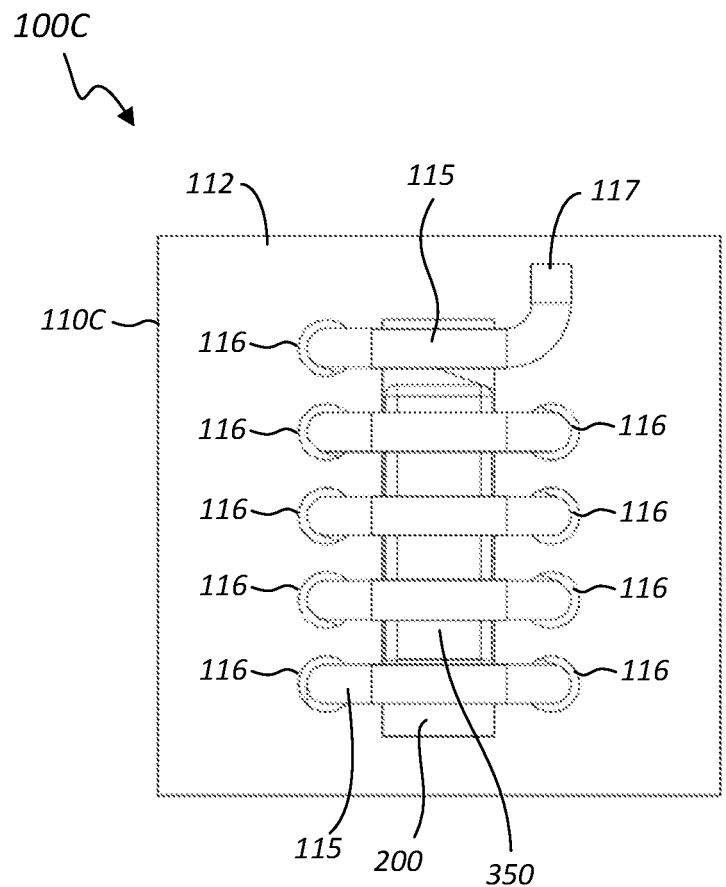
FIG. 19 shows a top view of the inductor of FIG. 16 in accordance with an embodiment of the present invention.

FIG. 19 shows a top view of the inductor 100C in accordance with an embodiment of the present invention. The inductor core 350 is located between the through holes 116 of the PCB 110C, and runs along the length of the inductor 100C within the coil formed by the wire 115. FIG. 19 shows the first end 117 of the wire 115 over the top layer 112.

Figure 20:
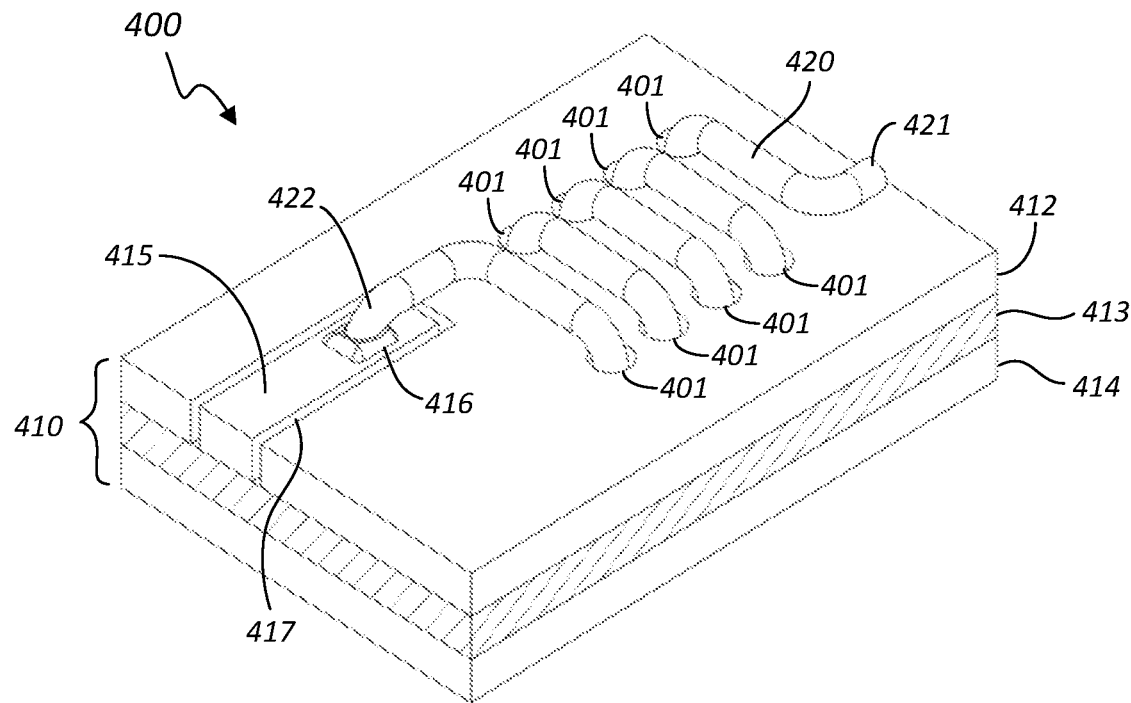
FIG. 20 shows a perspective view of an integrated antenna in accordance with an embodiment of the present invention.

FIG. 20 shows a perspective view of an integrated antenna 400 in accordance with an embodiment of the present invention. The antenna 400 is "integrated" in that it is integrated with a PCB 410. Only a section of the PCB 410 that includes the antenna 400 is shown for clarity of illustration. In one embodiment, the antenna 400 comprises an antenna body 415 and an inductor wire 420. The antenna body 415 comprises an electrically conducting material (e.g., copper).

The PCB 410 may comprise one or more layers of materials that are stacked one on top of another. In the example of FIG. 20, the PCB 410 has a top layer 412, one or more intermediate layers 413, and a bottom layer 414. The top layer 412 is the topmost layer of the PCB 410 and the bottom layer 414 is the bottommost layer of the PCB 410. The top layer 412 and the bottom layer 414 may each comprise an electrically conducting material (e.g., copper). The one or more intermediate layers 413 may comprise an electrically insulating material (e.g., FR-4 glass epoxy) or alternating layers of electrically insulating and electrically conducting materials.

Outermost surfaces of the top layer 412, bottom layer 414, or both may be coated with a solder mask. Electronic components may be mounted on the top layer 412 in the case where the PCB 410 is a single-sided PCB. Electronic components may be mounted on the top layer 412 and on the bottom layer 414 in the case where the PCB 410 is a double-sided PCB. Generally, the PCB 410 may be a conventional PCB that is adapted to accept the antenna 400 as disclosed herein.

The PCB 410 has a plurality of through holes 401, with each through hole 401 going all the way through the PCB 410. The wire 420 may comprise a continuous copper wire or other suitable material commonly used for antennas. The wire 420 may be coated with an electrically insulating material, e.g., copper wire that is coated with enamel. The wire 420 has a first end 421 and a second end 422. The first end 421 of the wire 420 is electrically connected to a node or electrical component of an electrical circuit (e.g., see FIG. 21, electrical circuit 424) having components mounted on the PCB 410. The second end 422 of the wire 420 is electrically connected to the antenna body 415 by way of a metal pad 416. The antenna body 415 is the end of the antenna 400, which in this embodiment is a monopole antenna. One end of the antenna body 415 is electrically connected to the wire 420, and an opposite end of the antenna body 415 is left electrically open, i.e., not connected to an electrical circuit or electronic component.

In one embodiment, the antenna body 415 is formed on the same plane as the top layer 412. The intermediate layer 413 directly under the antenna body 415 comprises a layer of electrically insulating material, such as FR-4 glass epoxy. A gap 417 electrically and physically separates the antenna body 415 from the top layer 412. The gap 417 may be an air gap that is subsequently filled by the solder mask. The size of the gap 417 may be varied to adjust the impedance of the antenna 400. The gap 417 may also be used as a ground guard to control electromagnetic interference (EMI).

The wire 420 is coiled through the PCB 410 one or more turns to form a loading coil of the antenna 400. The wire 420 goes from the top layer 412 toward the bottom layer 414 through a through hole 401, from the bottom layer 414 back toward the top layer 412 through another through hole 401, etc. The first end 421 of the wire 420 is depicted as being over the top layer 412. As can be appreciated, the first end 421 may also be under the bottom layer 414 or within the PCB 410 (i.e., between the layers 412 and 414). The first end 421 and the antenna body 415 may be on the same or opposite sides of the PCB 410.

Figure 21:
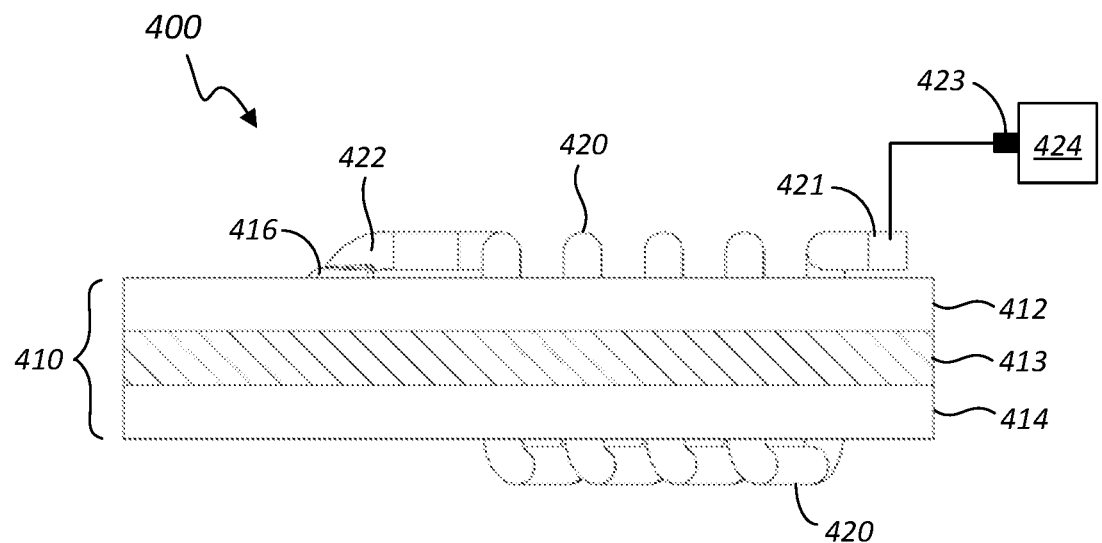
FIG. 21 shows a side view of the antenna of FIG. 20 in accordance with an embodiment of the present invention.

FIG. 21 shows a side view of the antenna 400 in accordance with an embodiment of the present invention. Also shown in FIG. 21 is a schematic representation of an electrical circuit 424 comprising electronic components (not shown) that are mounted on the PCB 410. The electrical circuit 424 may be a conventional electrical circuit commonly used in conjunction with antennas, such as a receiver, transmitter, amplifier, etc. The first end 421 of the wire 420 may be electrically connected to a node 423 of the electrical circuit 424. The node 423 may be a terminal of an electronic component of the electrical circuit 424. The wire 420 coils through the PCB 410 by going from the top layer 412 through the one or more intermediate layers 413 toward the bottom layer 414. From the bottom layer 414, the wire 420 continues through the one or more intermediate layers 413 toward the top layer 412, and so on until the second end 422 of the wire 420 electrically connects to the metal pad 416.

Figure 22:
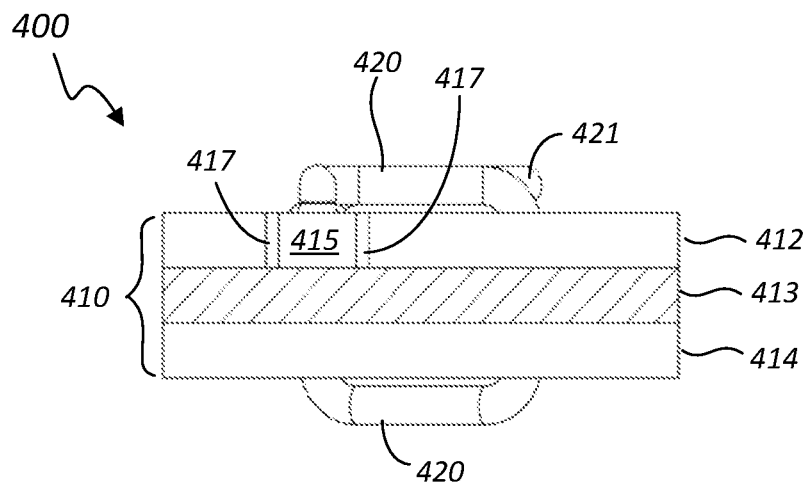
FIG. 22 shows a front view of the antenna of FIG. 20 in accordance with an embodiment of the present invention.

FIG. 22 shows a front view of the antenna 400 in accordance with an embodiment of the present invention. FIG. 22 shows the antenna 400 as seen with the antenna body 415 facing the viewer. The antenna body 415 may be formed on the same plane as the top layer 412, with the gap 417 physically and electrically separating the antenna body 415 from the top layer 412. The wire 420 coils through the layers 412-414 of the PCB 410 one or more times to form a coil.

Figure 23:
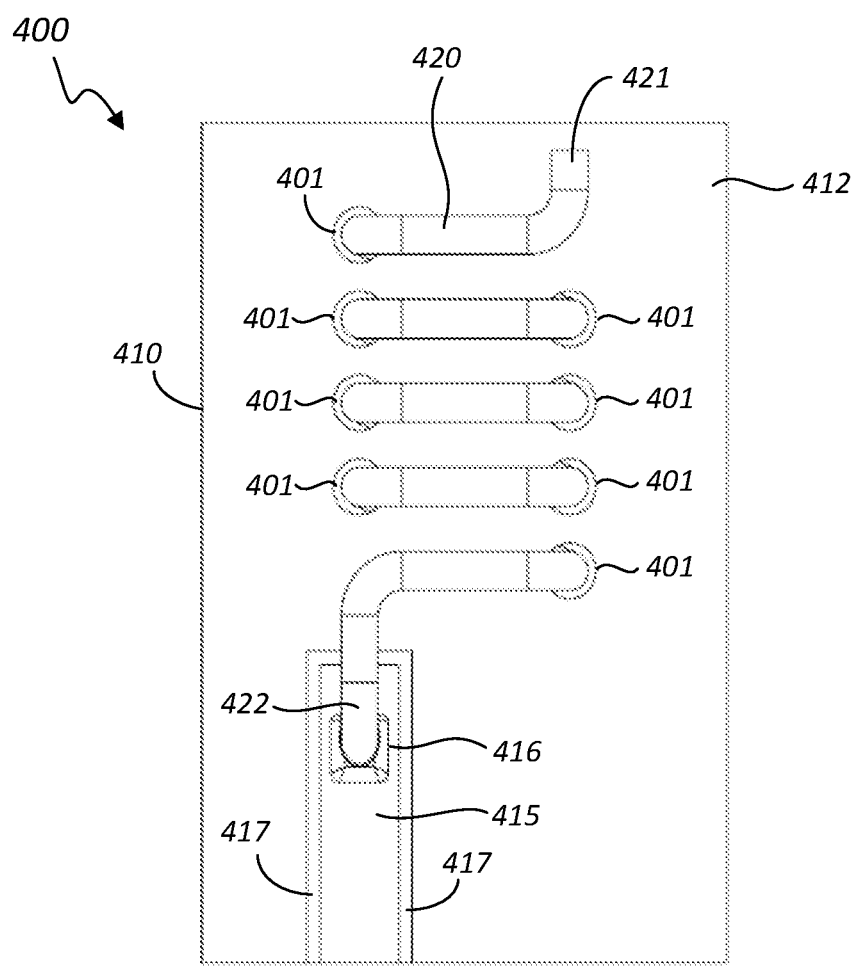
FIG. 23 shows a top view of the antenna of FIG. 20 in accordance with an embodiment of the present invention.

FIG. 23 shows a top view of the antenna 400 in accordance with an embodiment of the present invention. The wire 420 of the antenna 400 goes all the way through the PCB 410 by way of the through holes 401. The first end 421 of the wire 420 is depicted as being over the top layer 412 of the PCB 410. The second end 422 of the wire 420 is electrically connected to the antenna body 415 by way of the metal pad 416. The gap 417 physically and electrically separates the antenna body 415 from the top layer 412.

Figure 24:
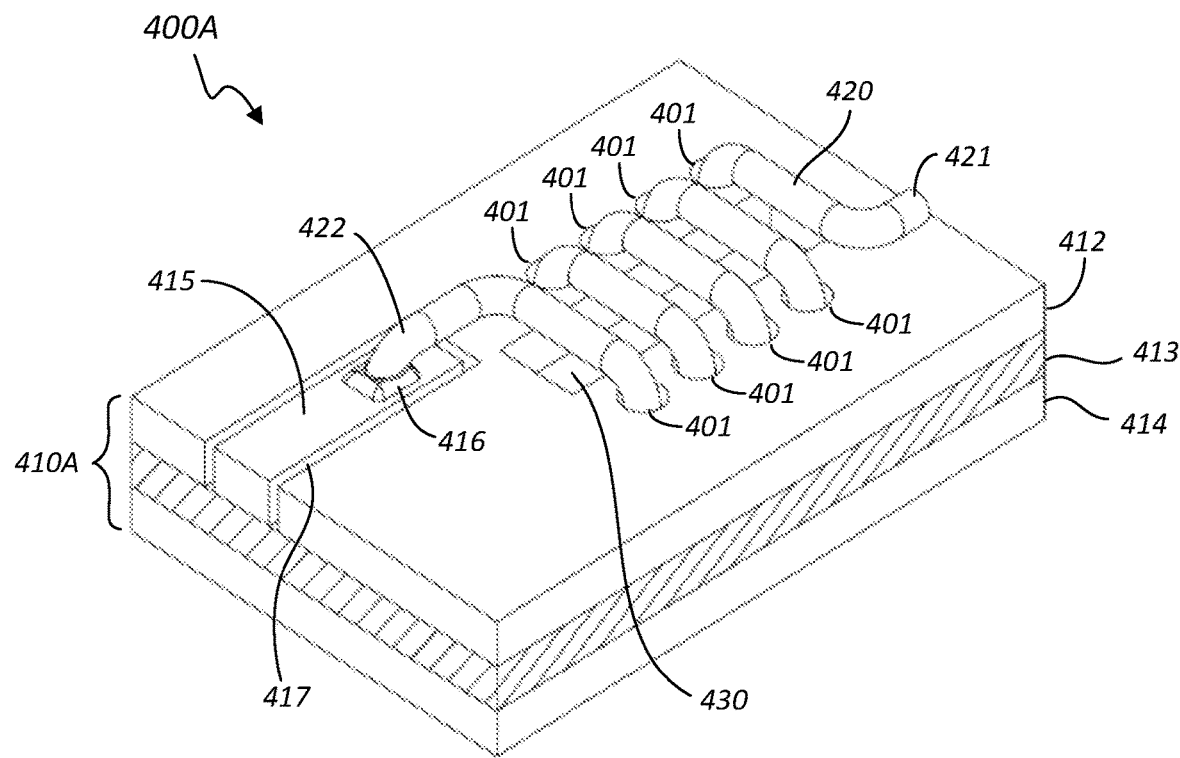
FIG. 24 shows a perspective view of an integrated antenna in accordance with an embodiment of the present invention.

FIG. 24 shows a perspective view of an integrated antenna 400A in accordance with an embodiment of the present invention. The antenna 400A is the same as the antenna 400 (shown in FIGS. 20-23), except that the PCB 410A of the antenna 400A has a cutout 430. The PCB 410A and PCB 410 are otherwise the same.

The cutout 430 may be an empty, rectangular space that is cut all the way through the layers 412-414 of the PCB 410A and runs along the length of the antenna 400A. The wire 420 is coiled through the PCB 410A one or more turns by way of the through holes 401 to form a coil, with the cutout 430 being disposed within the coil. The wire 420 goes from the top layer 412 toward the bottom layer 414 through a through hole 401, from the bottom layer 414 back toward the top layer 412 through another through hole 401, etc. The gap 417 electrically and physically separates the antenna body 415 from the top layer 412. The second end 422 of the wire 420 is electrically connected to the antenna body 415 by way of the metal pad 416. The first end 421 of the wire 420 is depicted as being over the top layer 412. The first end 421 may also be under the bottom layer 414 or within the PCB 410A. The first end 421 and the antenna body 415 may be on the same or opposite sides of the PCB 410A.

Figure 25:
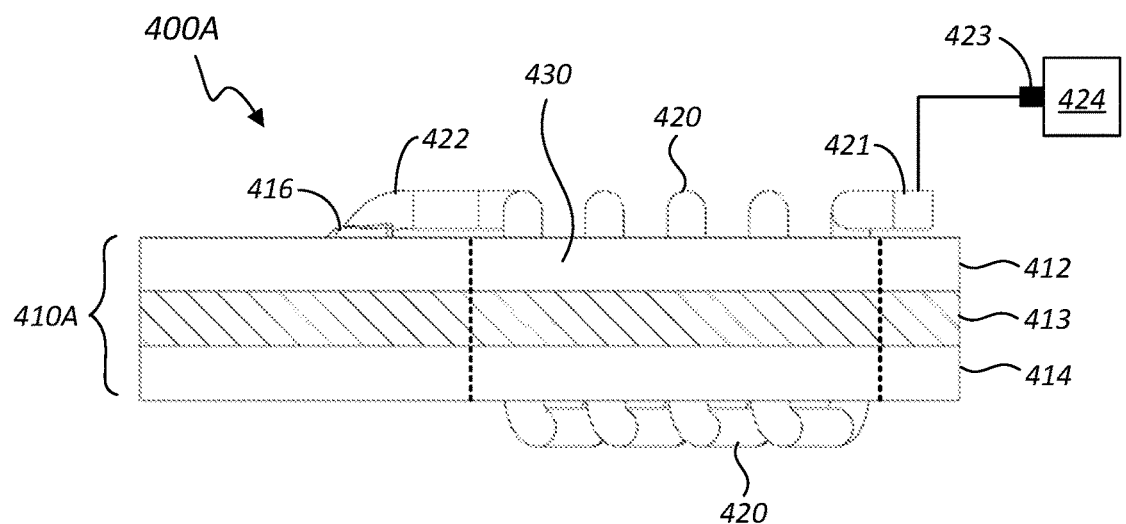
FIG. 25 shows a side view of the antenna of FIG. 24 in accordance with an embodiment of the present invention.

FIG. 25 shows a side view of the antenna 400A in accordance with an embodiment of the present invention. In FIG. 25, dotted lines represent the cutout 430 through the PCB 410A. The cutout 430 is cut through the layers 412-414, thereby creating an air core within the coil formed by the wire 420.

Also shown in FIG. 25 is a schematic representation of the electrical circuit 424 comprising electronic components (not shown) that are mounted on the PCB 410A. The first end 421 may be electrically connected to a node 423 of the electrical circuit 424. The wire 420 coils through the PCB 410A by going from the top layer 412 through the one or more intermediate layers 413 toward the bottom layer 414. From the bottom layer 414, the wire 420 continues through the one or more intermediate layers 413 toward the top layer 412, and so on until the second end 422 of the wire 420 electrically connects to the metal pad 416.

Figure 26:
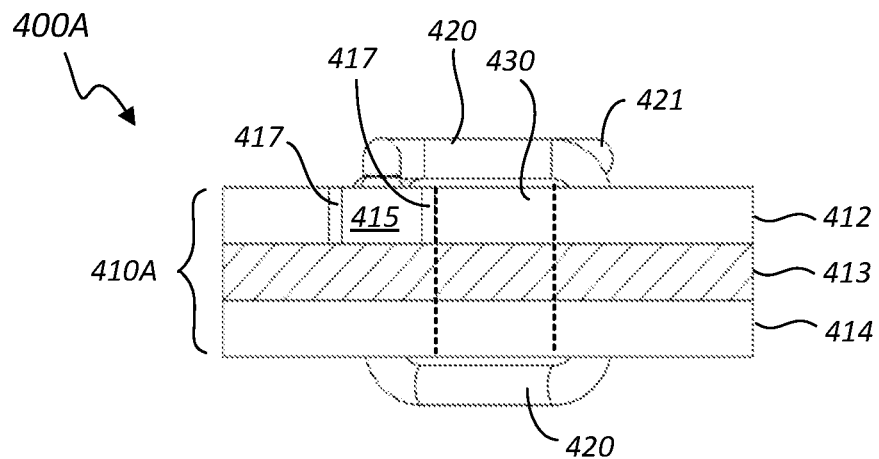
FIG. 26 shows a front view of the antenna of FIG. 24 in accordance with an embodiment of the present invention.

FIG. 26 shows a front view of the antenna 400A in accordance with an embodiment of the present invention. FIG. 26 shows the antenna 400A as seen with the antenna body 415 facing the viewer. In FIG. 26, dotted lines represent the cutout 430 through the layers 412-414 of the PCB 410A. The antenna body 415 is depicted as being formed on the same plane as the top layer 412, with the gap 417 physically and electrically separating the antenna body 415 from the top layer 412.

Figure 27:
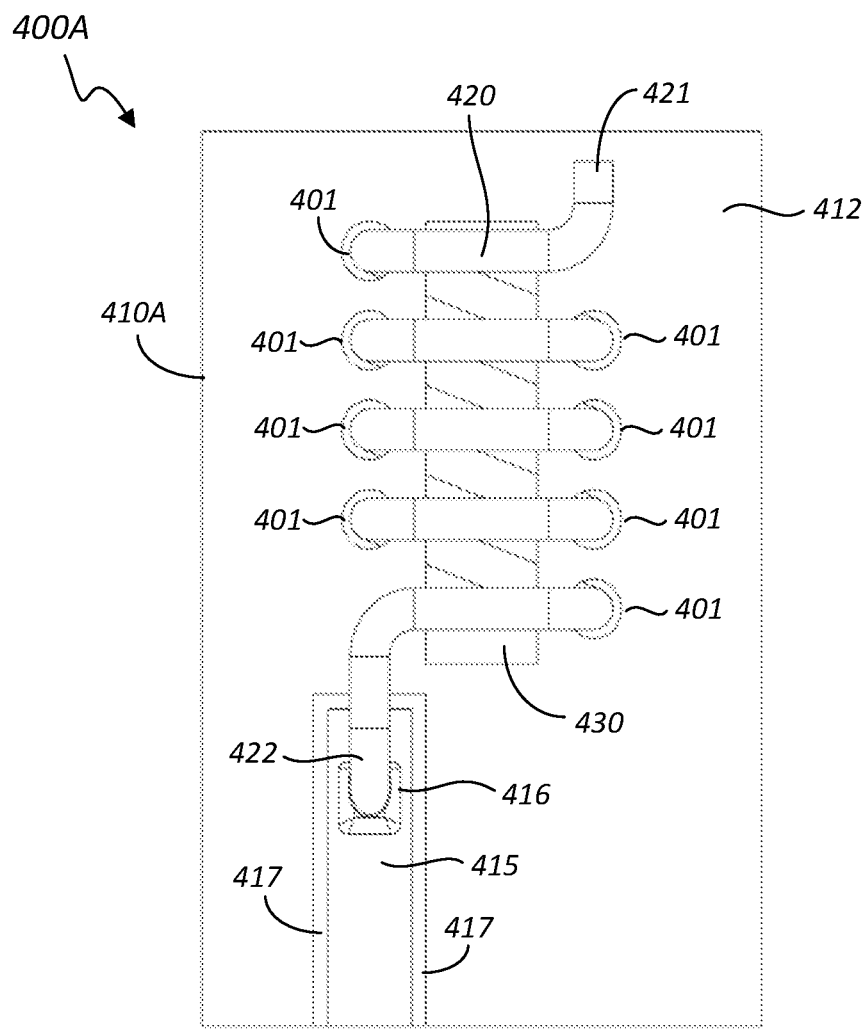
FIG. 27 shows a top view of the antenna of FIG. 24 in accordance with an embodiment of the present invention.

FIG. 27 shows a top view of the antenna 400A in accordance with an embodiment of the present invention. The cutout 430 is located between the through holes 401 of the PCB 410A, and runs along the length of the antenna 400A within the coil formed by the wire 420. FIG. 27 shows the first end 421 of the wire 420 over the top layer 412. The second end 422 of the wire 420 is electrically connected to the antenna body 415 by way of the metal pad 416. The gap 417 physically and electrically separates the antenna body 415 from the top layer 412.

The wire 420 of the antenna 400A is coiled around the cutout 430 to form a coil with an air core. Because air is a non-magnetic material, the electrical characteristics of the antenna 400A is similar to that of the antenna 400. As will be more apparent below, the cutout 430 that forms the air core may accept a magnetic core to adjust the inductance of the antenna 400A to meet a target resonance frequency or other electrical specification. The adjustability of the inductance of the antenna 400A is particularly important in circuit applications where the capacitance is fixed or is not easily adjusted.

Figure 28:
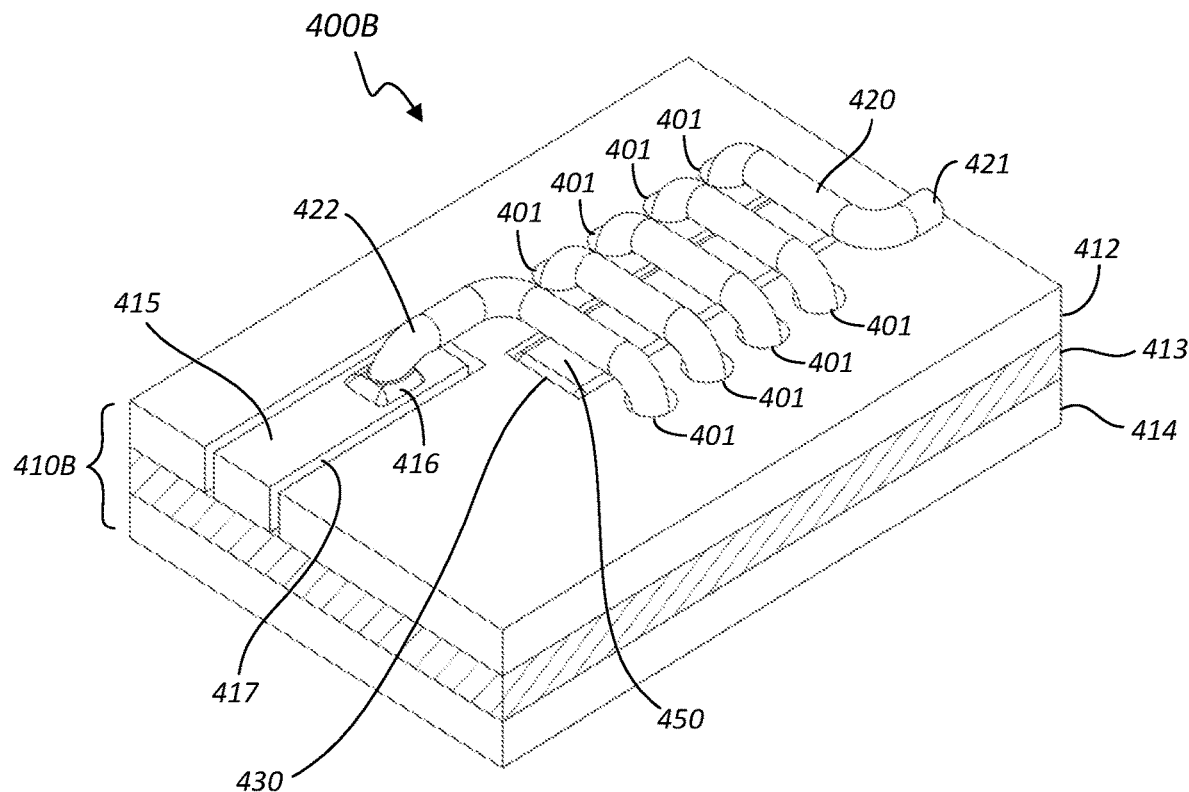
FIG. 28 shows a perspective view of an integrated antenna in accordance with an embodiment of the present invention.

FIG. 28 shows a perspective view of an integrated antenna 400B in accordance with an embodiment of the present invention. The antenna 400B is the same as the antenna 400A (shown in FIGS. 24-27), except that the PCB 410B of the antenna 400B has an inductor core 450 disposed in the cutout 430. The PCB 410B and PCB 410A are otherwise the same.

The inductor core 450 may comprise a magnetic material commonly used in inductors, such as iron powder and ferrites. The inductor core 450 is disposed in the cutout 430. The inductor core 450 may be fitted into the cutout 430, attached into the cutout 430 by adhesives, held in position by support structures (not shown) in the cutout 430, etc. The inductor core 450 may have a rectangular shape, cylindrical shape, two-half cylindrical shapes, or other shape that fits in the cutout 430. Changing the shape and/or size of the inductor core 450 allows for adjustment of the inductance of the integrated antenna.

The through holes 401 go all the way through the layers 412-414. The wire 420 of the antenna 400B is coiled through the PCB 410B one or more turns by way of the through holes 401 to form a coil, with the inductor core 450 being disposed within the coil and running along the length of the antenna 400B. The wire 420 goes from the top layer 412 toward the bottom layer 414 through a through hole 401, from the bottom layer 414 back toward the top layer 412 through another through hole 401, etc. The gap 417 electrically and physically separates the antenna body 415 from the top layer 412. The second end 422 of the wire 420 is electrically connected to the antenna body 415 by way of the metal pad 416. The first end 421 of the wire 420 is depicted as being over the top layer 412. The first end 421 may also be under the bottom layer 414 or within the PCB 410B. The first end 421 and the antenna body 415 may be on the same or opposite sides of the PCB 410B.

Figure 29:
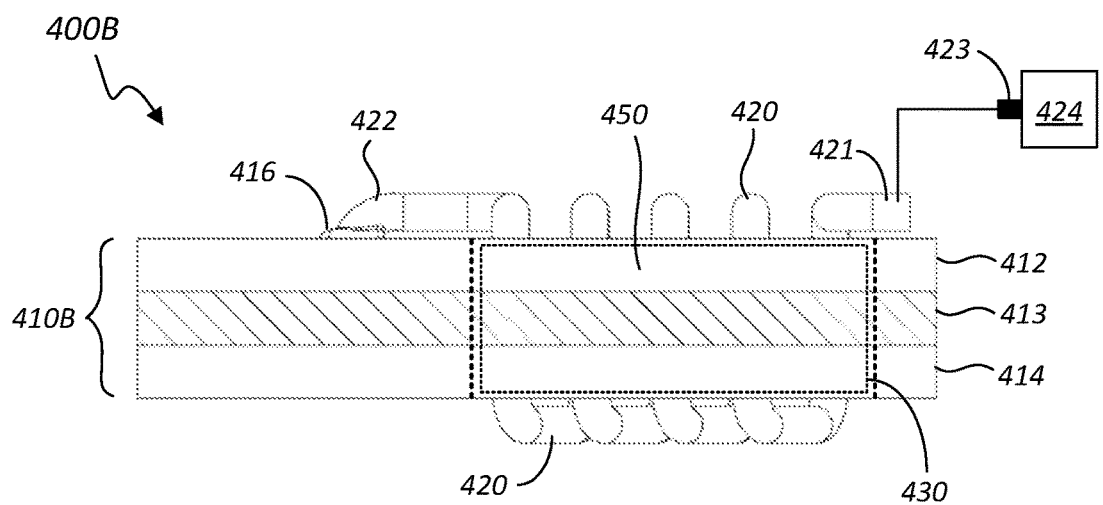
FIG. 29 shows a side view of the antenna of FIG. 28 in accordance with an embodiment of the present invention.

FIG. 29 shows a side view of the antenna 400B in accordance with an embodiment of the present invention. In FIG. 29, dotted lines represent the cutout 430, and a dotted rectangular box represents the inductor core 450 disposed in the cutout 430. The cutout 430 is cut through the layers 412-414, thereby creating an empty space in which the inductor core 450 is disposed within the coil formed by the wire 420. The inductor core substantially completely fills the cutout 430.

Also shown in FIG. 29 is a schematic representation of the electrical circuit 424 comprising electronic components (not shown) that are mounted on the PCB 410B. The first end 421 may be electrically connected to the node 423 of the electrical circuit 424. The wire 420 coils through the PCB 410B by going from the top layer 412 through the one or more intermediate layers 413 toward the bottom layer 414. From the bottom layer 414, the wire 420 continues through the one or more intermediate layers 413 toward the top layer 412, and so on until the second end 422 of the wire 420 electrically connects to the metal pad 416.

Figure 30:
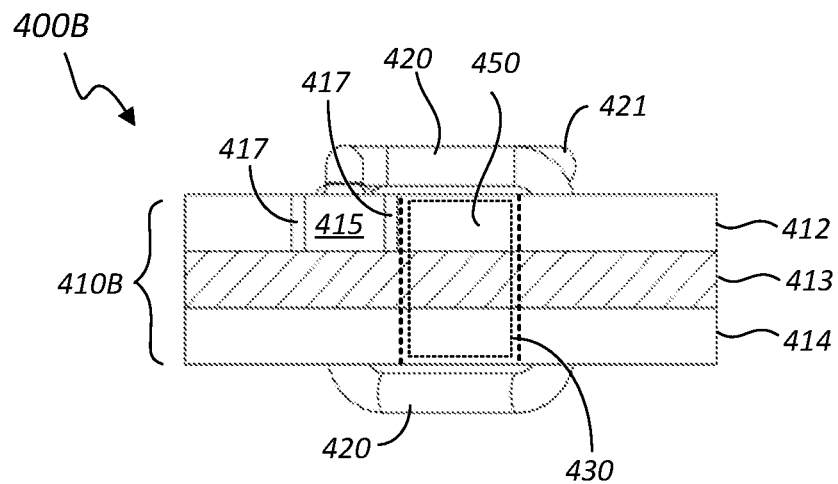
FIG. 30 shows a front view of the antenna of FIG. 28 in accordance with an embodiment of the present invention.

FIG. 30 shows a front view of the antenna 400B in accordance with an embodiment of the present invention. FIG. 30 shows the antenna 400B as seen with the antenna body 415 facing the viewer. In FIG. 30, dotted lines represent the cutout 430, and a dotted rectangular box represents the inductor core 450 disposed in the cutout 430. The wire 420 coils through the layers 412-414 of the PCB 410B one or more times to form a coil, with the inductor core 450 being located within the coil. The antenna body 415 is depicted as being formed on the same plane as the top layer 412, with the gap 417 physically and electrically separating the antenna body 415 from the top layer 412.

Figure 31:
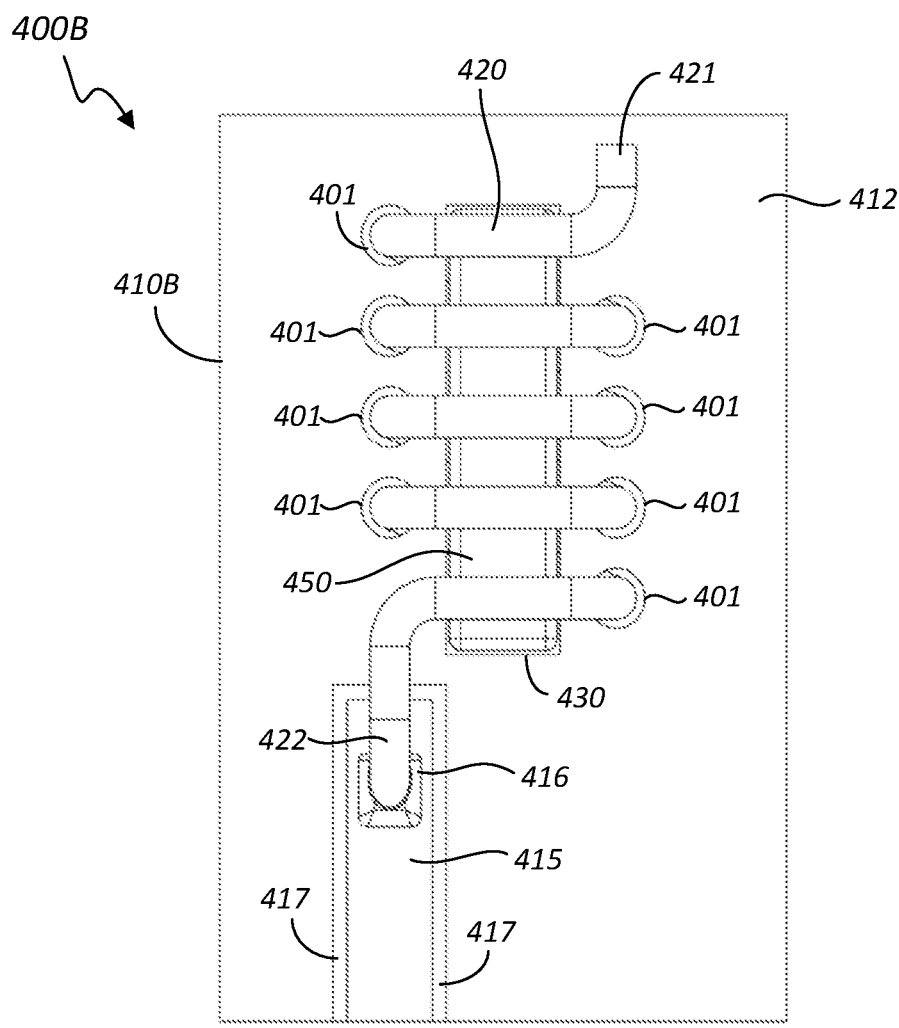
FIG. 31 shows a top view of the antenna of FIG. 28 in accordance with an embodiment of the present invention.

FIG. 31 shows a top view of the antenna 400B in accordance with an embodiment of the present invention. The inductor core 450 is located between the through holes 401 of the PCB 410B, and runs along the length of the antenna 400B within the coil formed by the wire 420. FIG. 31 shows the first end 421 of the wire 420 over the top layer 412. The second end 422 of the wire 420 is electrically connected to the antenna body 415 by way of the metal pad 416. The gap 417 physically and electrically separates the antenna body 415 from the top layer 412.

Figure 32:
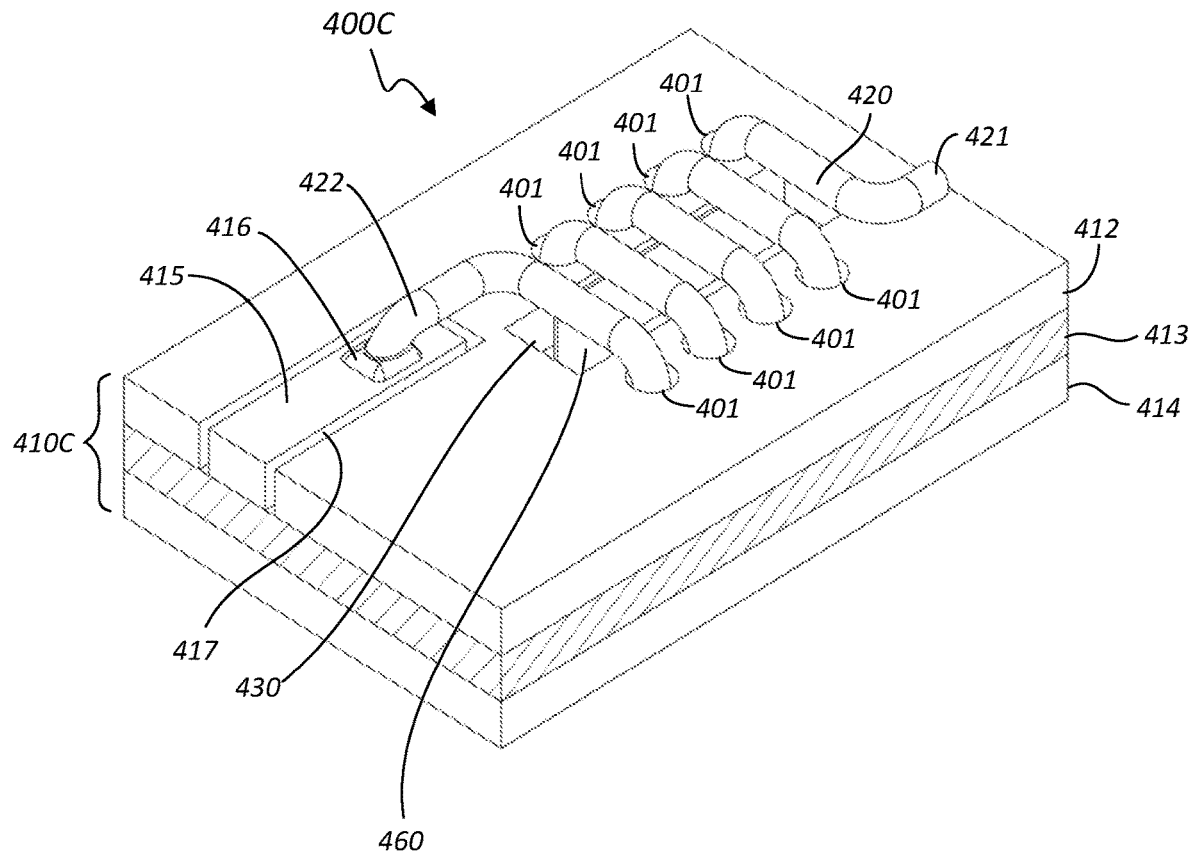
FIG. 32 shows a perspective view of an integrated antenna in accordance with an embodiment of the present invention.

FIG. 32 shows a perspective view of an integrated antenna 400C in accordance with an embodiment of the present invention. The antenna 400C is the same as the antenna 400B (shown in FIGS. 28-31), except that the PCB 410C of the antenna 400C has an inductor core 460, instead of the inductor core 450, in the cutout 430. The PCB 410C and PCB 410B are otherwise the same.

The inductor core 460 is the same as the inductor core 450 except that the inductor core 460 has a smaller physical dimension than the inductor core 450. Accordingly, unlike the inductor core 450, the inductor core 460 does not completely fill the empty space of the cutout 430 in the PCB 410C. For example, the physical size of the inductor core 460 may be 70% of that of the inductor core 450. Advantageously, by using different inductor core materials, shapes, and sizes, the inductance of the antenna may be optimized for different circuit applications. More particularly, using the same PCB with cutout, the inductance of the antenna may be adjusted to optimize a corresponding electrical circuit by simply replacing the inductor core in the cutout.

The through holes 401 go all the way through the layers 412-414. The wire 420 of the antenna 400C is coiled through the PCB 410C one or more turns to form a coil, with the inductor core 460 being disposed within the coil and running along the length of the antenna 400C. The wire 420 goes from the top layer 412 toward the bottom layer 414 through a through hole 401, from the bottom layer 414 back toward the top layer 412 through another through hole 401, etc. The gap 417 electrically and physically separates the antenna body 415 from the top layer 412. The second end 422 of the wire 420 is electrically connected to the antenna body 415 by way of the metal pad 416. The first end 421 of the wire 420 is depicted as being over the top layer 412. The first end 421 may also be under the bottom layer 414 or within the PCB 410C. The first end 421 and the antenna body 415 may be on the same or opposite sides of the PCB 410C.

Figure 33:
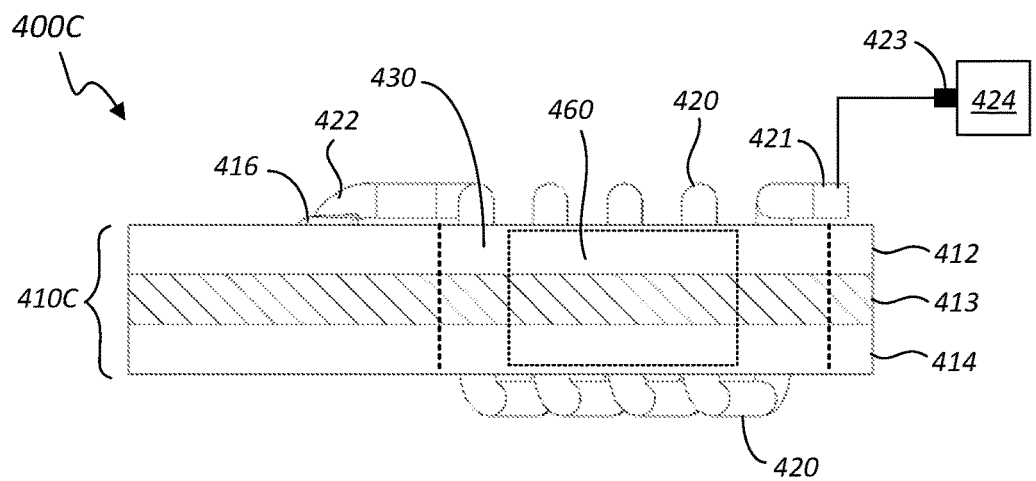
FIG. 33 shows a side view of the antenna of FIG. 32 in accordance with an embodiment of the present invention.

FIG. 33 shows a side view of the antenna 400C in accordance with an embodiment of the present invention. In FIG. 33, dotted lines represent the cutout 430, and a dotted rectangular box represents the inductor core 460 disposed in the cutout 430. The cutout 430 is cut through the layers 412-414, thereby creating an empty space in which the inductor core 460 is disposed within the coil formed by the wire 420. It is to be noted that the inductor core 460 does not completely fill the empty space of the cutout 430 in the PCB 410C.

Also shown in FIG. 33 is a schematic representation of the electrical circuit 424 comprising electronic components that are mounted on the PCB 410C. The first end 421 may be electrically connected to the node 423 of the electrical circuit 424. The wire 420 coils through the PCB 410C by going from the top layer 412 through the one or more intermediate layers 413 toward the bottom layer 414. From the bottom layer 414, the wire 420 continues through the one or more intermediate layers 413 toward the top layer 412, and so on until the second end 422 electrically connects to the metal pad 416.

Figure 34:
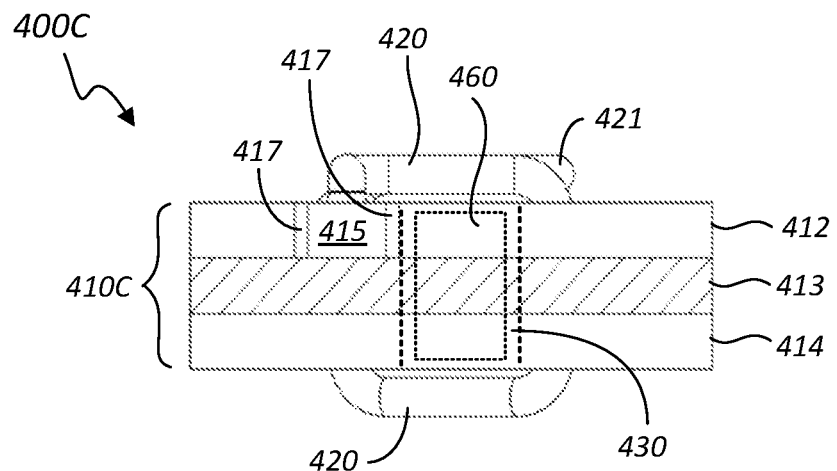
FIG. 34 shows a front view of the antenna of FIG. 32 in accordance with an embodiment of the present invention.

FIG. 34 shows a front view of the antenna 400C in accordance with an embodiment of the present invention. FIG. 34 shows the antenna 400C as seen with the antenna body 415 facing the viewer. In FIG. 34, dotted lines represent the cutout 430, and a dotted rectangular box represents the inductor core 460 disposed in the cutout 430. The wire 420 coils through the layers 412-414 of the PCB 410C one or more times to form a coil, with the inductor core 460 being located within the coil. The antenna body 415 is depicted as being formed on the same plane as the top layer 412, with the gap 417 physically and electrically separating the antenna body 415 from the top layer 412.

Figure 35:
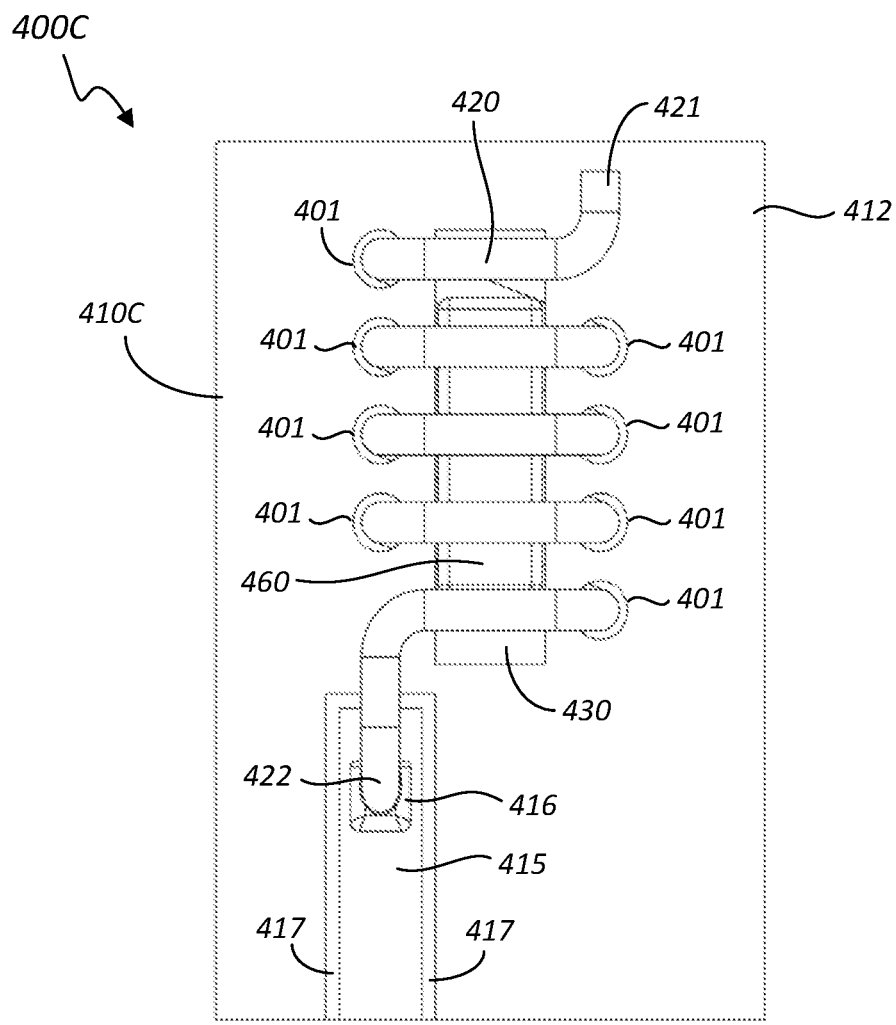
FIG. 35 shows a top view of the antenna of FIG. 32 in accordance with an embodiment of the present invention.

FIG. 35 shows a top view of the antenna 400C in accordance with an embodiment of the present invention. The inductor core 460 is located between the through holes 401 of the PCB 410C, and runs along the length of the antenna 400C within the coil formed by the wire 420. FIG. 35 shows the first end 421 of the wire 420 over the top layer 412. The second end 422 of the wire 420 is electrically connected to the antenna body 415 by way of the metal pad 416. The gap 417 physically and electrically separates the antenna body 415 from the top layer 412.

Printed circuit boards with integrated inductors and antennas have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A printed circuit board (PCB) having electronic components of an electrical circuit mounted thereon, the PCB comprising:
   a first layer that is a topmost layer of the PCB;
   a second layer below the first layer, the second layer being a bottommost layer of the PCB;

a plurality of holes through the first and second layers; and an inductor that is integrated with the PCB, the inductor comprising an inductor wire that is coiled through the PCB one or more turns by way of the plurality of holes, wherein the inductor further comprises an inductor core that is embedded in the PCB and disposed within a coil formed by the inductor wire, wherein the inductor core is disposed in a cutout in the PCB, the cutout being disposed within the coil formed by the inductor wire.

2. The PCB of claim 1, wherein the inductor core substantially completely fills the cutout.

3. The PCB of claim 1, wherein the inductor core does not completely fill the cutout.

4. The PCB of claim 1, wherein the cutout cuts through the first and second layers of the PCB.

5. The PCB of claim 1, wherein the inductor wire comprises copper with an enamel coating.

6. The PCB of claim 1, wherein a first end of the inductor wire is electrically connected to a first node of the electrical circuit and a second end of the inductor wire is electrically connected to a second node of the electrical circuit.

7. The PCB of claim 6, wherein the first end of the inductor wire is over the first layer and the second end of the inductor wire is under the second layer.

8. The PCB of claim 1, further comprising:

an antenna body disposed on a same plane as the first layer; and an air gap that physically separates the antenna body from the first layer, wherein an end of the antenna body is electrically connected to an end of the inductor wire.

9. A printed circuit board (PCB) having electronic components of an electrical circuit mounted thereon, the PCB comprising:

a topmost layer;

a bottommost layer; and an inductor that is integrated with the PCB, the inductor comprising:

an inductor wire that is coiled through the topmost layer and the bottommost layer of the PCB one or more turns; and an inductor core that is embedded in the PCB, the inductor core running along a length of the inductor and is disposed within a coil formed by the inductor wire, wherein the PCB further comprises a cutout that cuts through the topmost layer and the bottommost layer of the PCB, the inductor core comprises a magnetic material that is embedded in the cutout, and the cutout is disposed within the coil formed by the inductor wire.

10. The PCB of claim 9, wherein a first end of the inductor wire is electrically connected to a first node of the electrical circuit, a second end of the inductor wire is electrically connected to a second node of the electrical circuit, and the first and second ends of the inductor wire are on opposite sides of the PCB.

11. A printed circuit board (PCB) having electronic components of an electrical circuit mounted thereon, the PCB comprising:

a topmost layer;

a bottommost layer;

an inductor wire that is coiled through the topmost layer and the bottommost layer of the PCB one or more turns;

a cutout that is disposed within a coil formed by the inductor wire; and an antenna body that is electrically connected to a first end of the inductor wire, wherein an inductor core is disposed in the cutout.

12. The PCB of claim 11, wherein the antenna body is disposed on a same plane as the topmost layer.

13. The PCB of claim 12, further comprising an air gap that physically separates the antenna body from the topmost layer.

* * * * *